US012707749B2

(12) United States Patent
Tozawa

(10) Patent No.: US 12,707,749 B2
(45) Date of Patent: Aug. 11, 2026

(54) SEMICONDUCTOR DEVICE AND IMAGING DEVICE

(71) Applicant: SONY SEMICONDUCTOR SOLUTIONS CORPORATION, Kanagawa (JP)

(72) Inventor: Katsunori Tozawa, Kanagawa (JP)

(73) Assignee: Sony Semiconductor Solutions Corporation, Kanagawa (JP)

(*) Notice: Subject to any disclaimer, the term of this patent is extended or adjusted under 35 U.S.C. 154(b) by 354 days.

(21) Appl. No.: 18/548,669

(22) PCT Filed: Jan. 18, 2022

(86) PCT No.: PCT/JP2022/001491
§ 371 (c)(1),
(2) Date: Sep. 1, 2023

(87) PCT Pub. No.: WO2022/190640
PCT Pub. Date: Sep. 15, 2022

(65) Prior Publication Data

US 2024/0153982 A1 May 9, 2024

(30) Foreign Application Priority Data

Mar. 11, 2021 (JP) ................................ 2021-039398

(51) Int. Cl.
*H10F 39/00* (2025.01)
*H04N 25/79* (2023.01)

(52) U.S. Cl.
CPC .......... *H10F 39/811* (2025.01); *H04N 25/79* (2023.01); *H10F 39/804* (2025.01); *H10F 39/809* (2025.01)

(58) Field of Classification Search
CPC .... H10F 39/811; H10F 39/804; H10F 39/809; H04N 25/79; H04N 23/52; H10W 90/00; H01L 25/0657
See application file for complete search history.

(56) References Cited

U.S. PATENT DOCUMENTS

2004/0084726 A1* 5/2004 Kim .................... H01L 23/367 257/E23.102
2007/0231966 A1* 10/2007 Egawa ............... H01L 23/3128 257/E21.597

(Continued)

FOREIGN PATENT DOCUMENTS

JP H11-67769 3/1999
JP 2002-334967 11/2002

(Continued)

OTHER PUBLICATIONS

International Search Report and Written Opinion prepared by the Japan Patent Office on Mar. 16, 2022, for International Application No. PCT/JP2022/001491, 3 pgs.

*Primary Examiner* — S M Sohel Imtiaz
(74) *Attorney, Agent, or Firm* — SHERIDAN ROSS P.C.

(57) ABSTRACT

The present technology relates to a semiconductor device and an imaging device capable of efficiently dissipating heat generated in a semiconductor package including a resin. A first substrate, a second substrate, a wiring layer that is located between the first substrate and the second substrate, and a slit that penetrates the first substrate and reaches the wiring layer are provided. The gap is provided for each wiring provided in the wiring layer. The present technology can be applied to, for example, a semiconductor device in which a chip on which an imaging element is formed and a chip that processes a signal from the imaging element are stacked.

20 Claims, 24 Drawing Sheets

(56) References Cited

U.S. PATENT DOCUMENTS

| | | | | |
|---|---|---|---|---|
| 2009/0256260 | A1* | 10/2009 | Nakamura | H10F 39/804<br>257/431 |
| 2013/0105924 | A1* | 5/2013 | Kobayashi | H10F 39/026<br>438/69 |
| 2016/0005787 | A1* | 1/2016 | Ho | H10F 39/8053<br>257/432 |
| 2018/0069037 | A1* | 3/2018 | Yang | H10F 39/807 |
| 2020/0035736 | A1* | 1/2020 | Nagahama | H10F 39/811 |
| 2020/0195916 | A1* | 6/2020 | Ishii | H10F 39/809 |

FOREIGN PATENT DOCUMENTS

| | | | |
|---|---|---|---|
| JP | 3663036 | B2 * | 6/2005 |
| JP | 2012-033878 | | 2/2012 |
| JP | 2012-114370 | | 6/2012 |
| JP | 2015-061041 | | 3/2015 |
| JP | 2016-181531 | | 10/2016 |
| JP | 2017-188611 | | 10/2017 |
| JP | 2020-098901 | | 6/2020 |
| WO | WO-2020262199 | A1 | 12/2020 |

* cited by examiner

FIG. 15
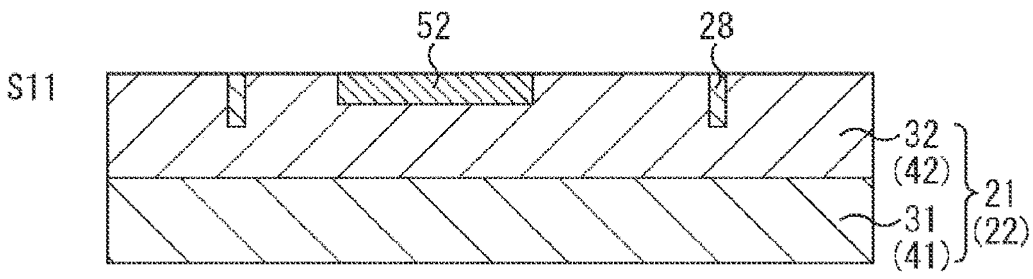
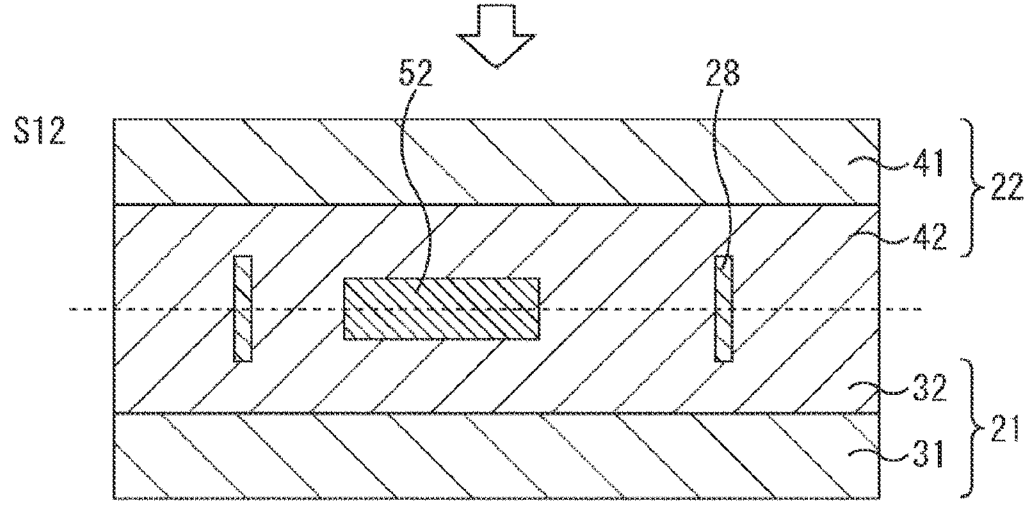
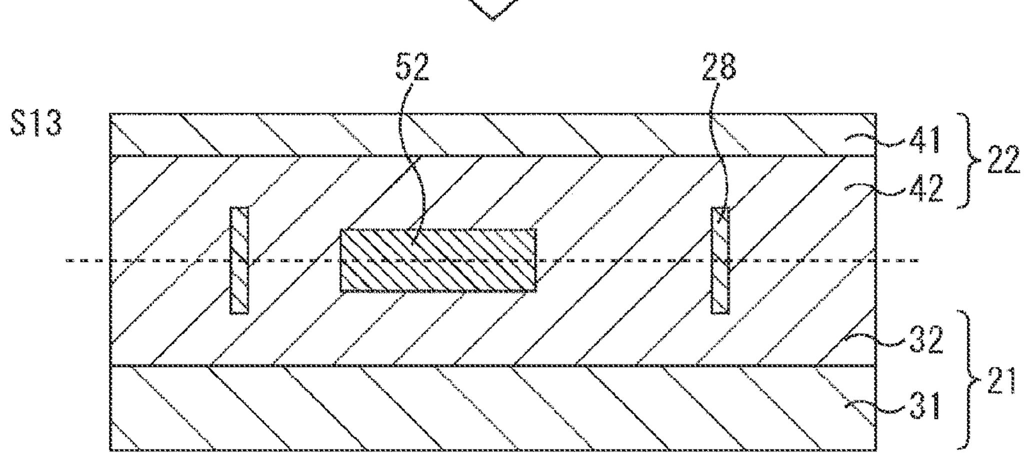

FIG. 16
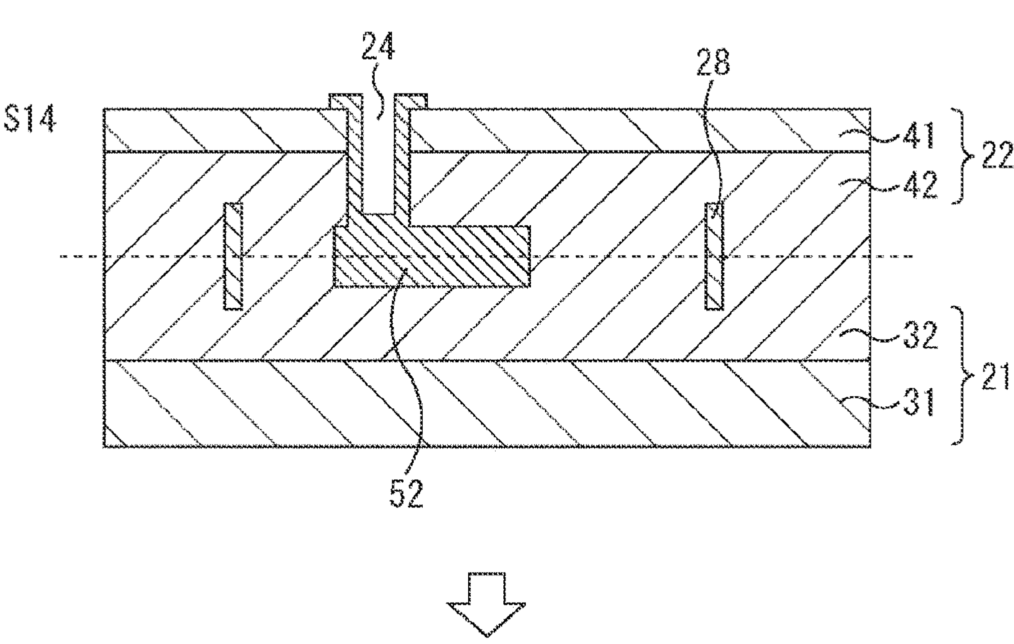
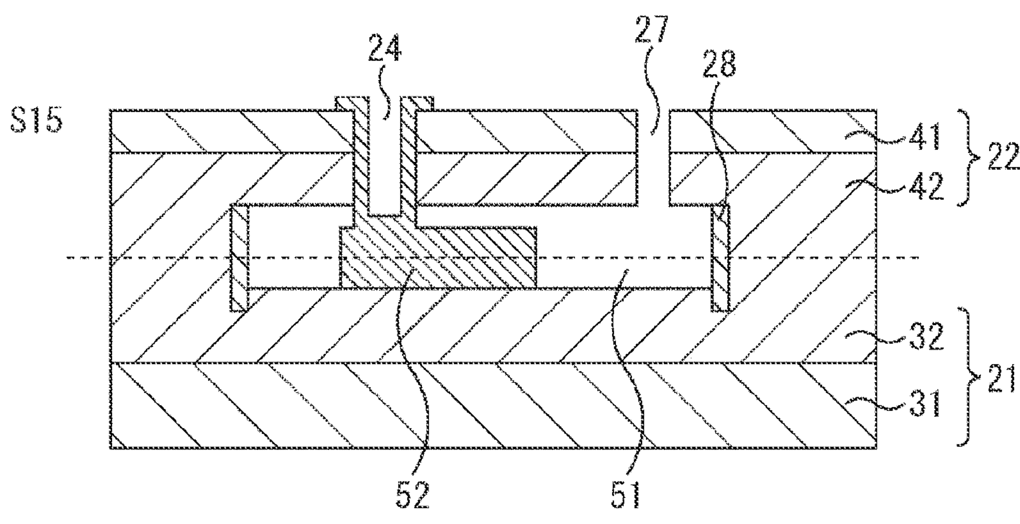

Figure 21:
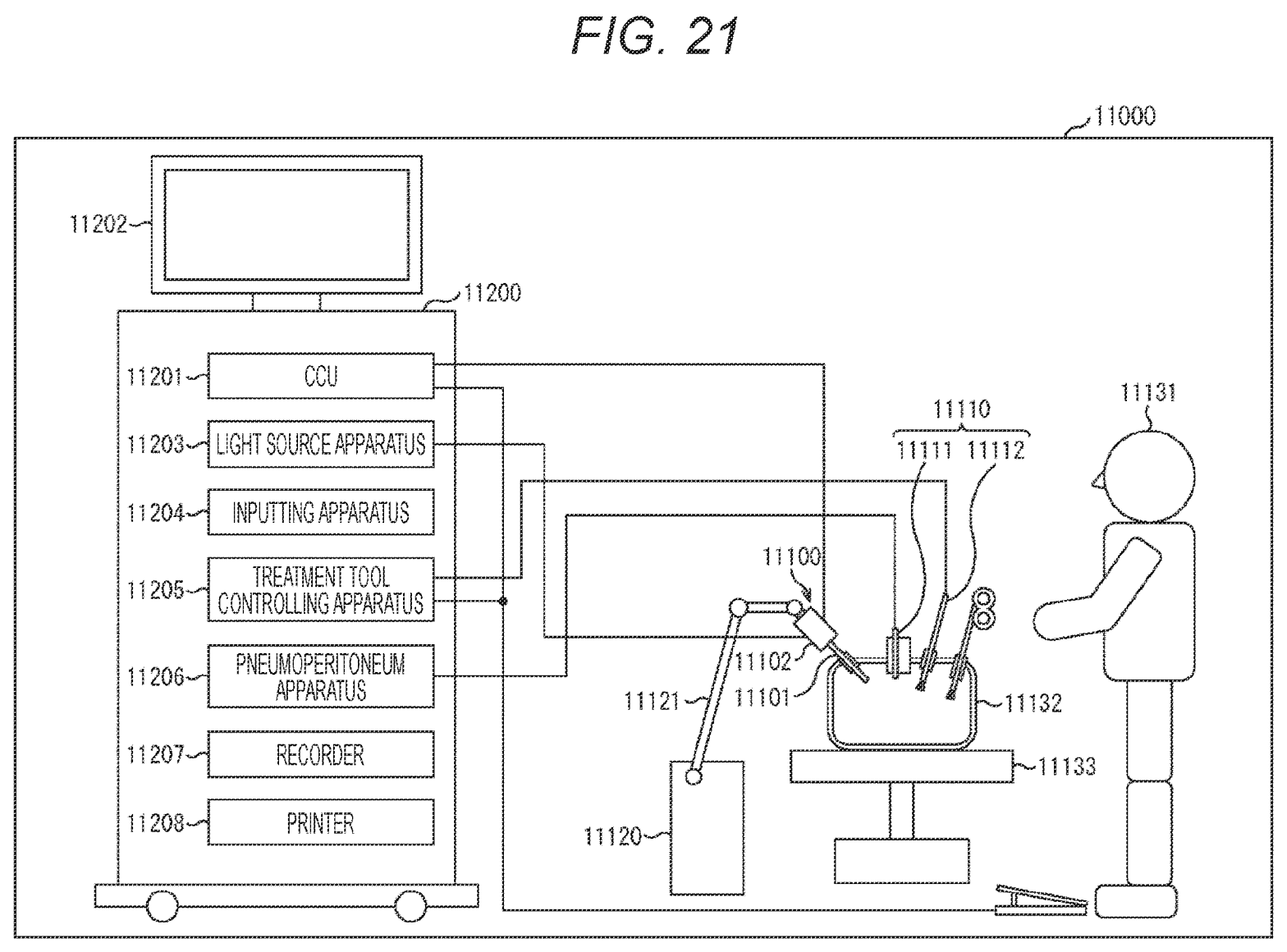

11000
11131
11132
11133
11110
11111
11112
11100
11102
11101
11121
11120
11200
CCU
LIGHT SOURCE APPARATUS
INPUTTING APPARATUS
TREATMENT TOOL CONTROLLING APPARATUS
PNEUMOPERITONEUM APPARATUS
RECORDER
PRINTER
11201
11203
11204
11205
11206
11207
11208
11202

Figure 23:
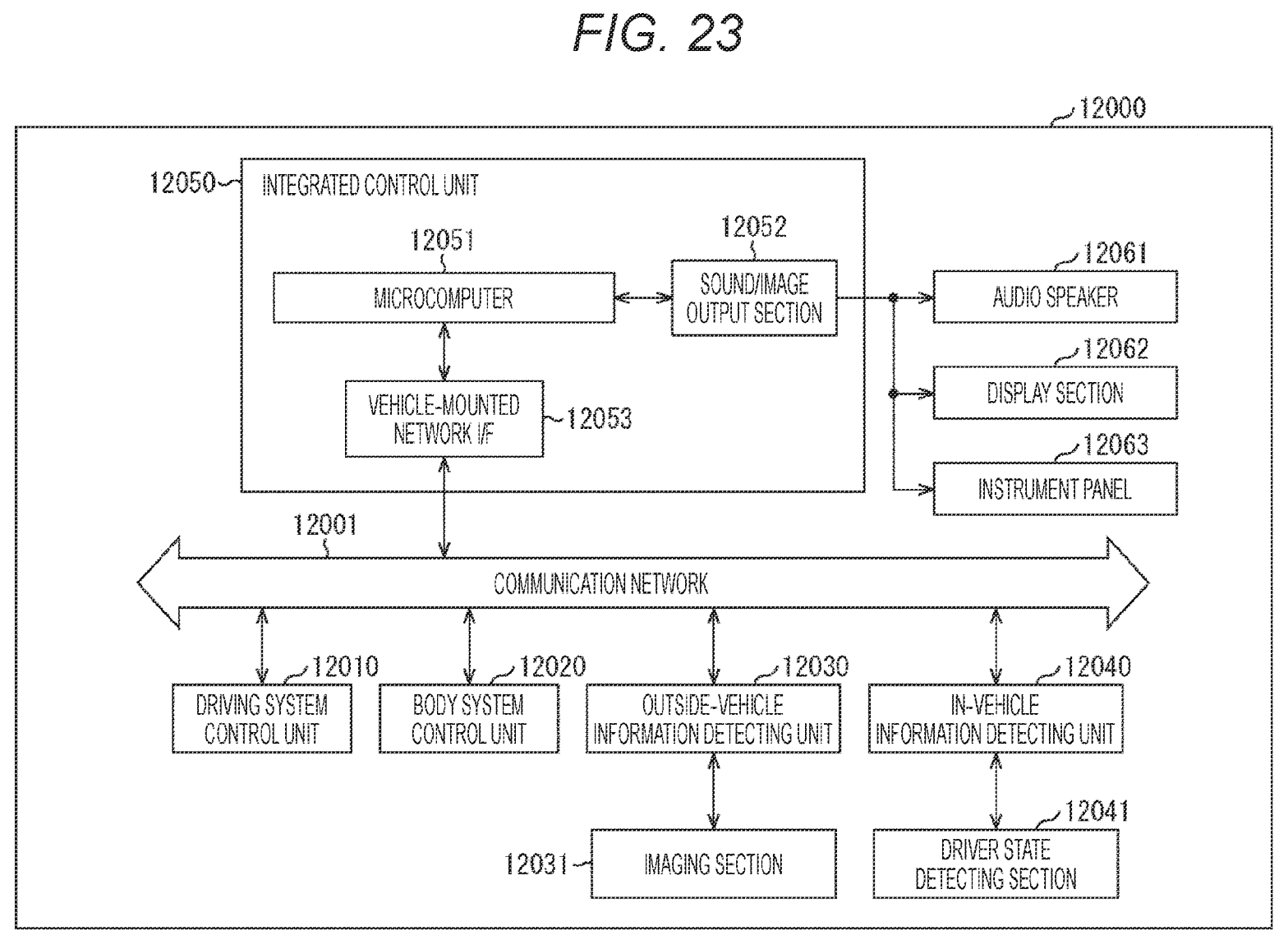

12050 INTEGRATED CONTROL UNIT

12051 MICROCOMPUTER

12052 SOUND/IMAGE OUTPUT SECTION

12053 VEHICLE-MOUNTED NETWORK I/F

12061 AUDIO SPEAKER

12062 DISPLAY SECTION

12063 INSTRUMENT PANEL

12001 COMMUNICATION NETWORK

12010 DRIVING SYSTEM CONTROL UNIT

12020 BODY SYSTEM CONTROL UNIT

12030 OUTSIDE-VEHICLE INFORMATION DETECTING UNIT

12031 IMAGING SECTION

12040 IN-VEHICLE INFORMATION DETECTING UNIT

12041 DRIVER STATE DETECTING SECTION

SEMICONDUCTOR DEVICE AND IMAGING DEVICE

CROSS REFERENCE TO RELATED APPLICATIONS

This application is a national stage application under 35 U.S.C. 371 and claims the benefit of PCT Application No. PCT/JP2022/001491, having an international filing date of 18 Jan. 2022, which designated the United States, which PCT application claimed the benefit of Japanese Patent Application No. 2021-039398, filed 11 Mar. 2021, the entire disclosures of each of which are incorporated herein by reference.

TECHNICAL FIELD

The present technology relates to a semiconductor device and an imaging device, and for example, relates to a semiconductor device and an imaging device with improved heat dissipation efficiency.

BACKGROUND ART

A package of an optical device on which an optical element such as an imaging element such as a charged-coupled device (CCD) or a complementary metal-oxide semiconductor (CMOS), a light receiving element such as a photo diode (PD), a micro electro mechanical systems (MEMS) element such as an optical switch or a mirror device, or a light emitting element such as a laser diode (LD), a light emitting diode (LED), or a vertical cavity surface emitting laser (VCSEL) is mounted is widely used (See, for example, Patent Document 1).

CITATION LIST

Patent Document

Patent Document 1: Japanese Patent Application Laid-Open No. 2015-61041

SUMMARY OF THE INVENTION

Problems to be Solved by the Invention

Since the above-described package is covered with a resin having a lower thermal conductivity than that of metal, a substrate, or the like, for example, heat generated in the substrate is not dissipated to the outside, and there has been a possibility that heat is accumulated in the package.

The present technology has been made in view of such a situation, and is intended to improve heat dissipation efficiency.

Solutions to Problems

A semiconductor device according to one aspect of the present technology is a semiconductor device including a first substrate, a second substrate, a wiring layer that is located between the first substrate and the second substrate, and a slit that penetrates the first substrate and reaches the wiring layer.

An imaging device according to one aspect of the present technology is an imaging device including a first chip on which a solid-state imaging element is formed, a second chip that processes a signal from the first chip, a wiring layer in which a first wiring layer included in the first chip and a second wiring layer included in the second chip are connected, a gap that is provided in part of the wiring layer, and a slit that penetrates the second chip connected to the gap.

In the semiconductor device according to one aspect of the present technology, the first substrate, the second substrate, the wiring layer that is located between the first substrate and the second substrate, and the slit that penetrates the first substrate and reaches the wiring layer are provided.

In the imaging device according to one aspect of the present technology, the first chip on which the solid-state imaging element is formed, the second chip that processes a signal from the first chip, the wiring layer in which the first wiring layer included in the first chip and the second wiring layer included in the second chip are connected, the gap that is provided in part of the wiring layer, and the slit that penetrates the second chip connected to the gap are provided.

Note that the imaging device may be an independent device or an internal block constituting one device.

BRIEF DESCRIPTION OF DRAWINGS

FIG. 4 is a cross-sectional view of the semiconductor device according to the second embodiment.

FIG. 5 is a view for explaining heat dissipation efficiency.

FIG. 6 is a view for explaining heat dissipation efficiency.

FIG. 11 is a plan view and a cross-sectional view of a semiconductor device according to a sixth embodiment.

FIG. 13 is a plan view and a cross-sectional view of a semiconductor device according to a seventh embodiment.

FIG. 14 is a cross-sectional view of the semiconductor device according to the seventh embodiment.

FIG. 15 is a view for explaining manufacturing of the semiconductor device.

FIG. 16 is a view for explaining manufacturing of the semiconductor device.

FIG. 19 is a view for explaining a configuration of a semiconductor device according to an eighth embodiment.

FIG. 21 is a view illustrating an example of a schematic configuration of an endoscopic surgery system.

FIG. 23 is a block diagram illustrating an example of a schematic configuration of a vehicle control system.

MODE FOR CARRYING OUT THE INVENTION

Hereinafter, modes for carrying out the present technology (hereinafter referred to as embodiments) will be described.

First Embodiment

The present technology described below can be applied to a semiconductor device including a chip of an imaging element such as a charged-coupled device (CCD) or a complementary metal-oxide semiconductor (CMOS). The present technology can also be applied to a semiconductor device including a chip of an optical element such as a light receiving element such as a photo diode (PD), a micro electro mechanical systems (MEMS) element such as an optical switch or a mirror device, or a light emitting element such as a laser diode (LD), a light emitting diode (LED), or a vertical cavity surface emitting laser (VCSEL).

Figure 1:
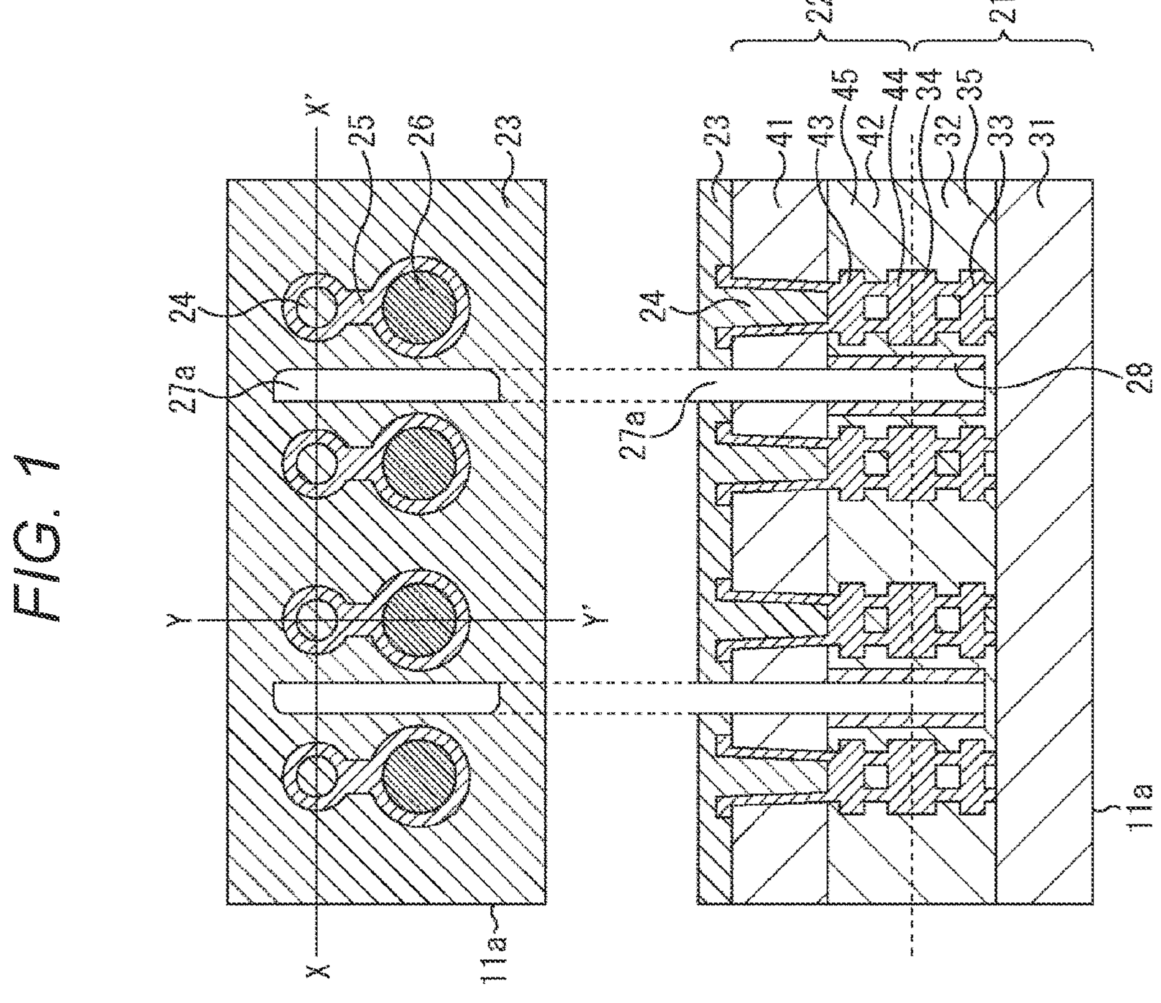
FIG. 1 is a view illustrating a configuration of an embodiment of a semiconductor device to which the present technology is applied.
Figure 2:
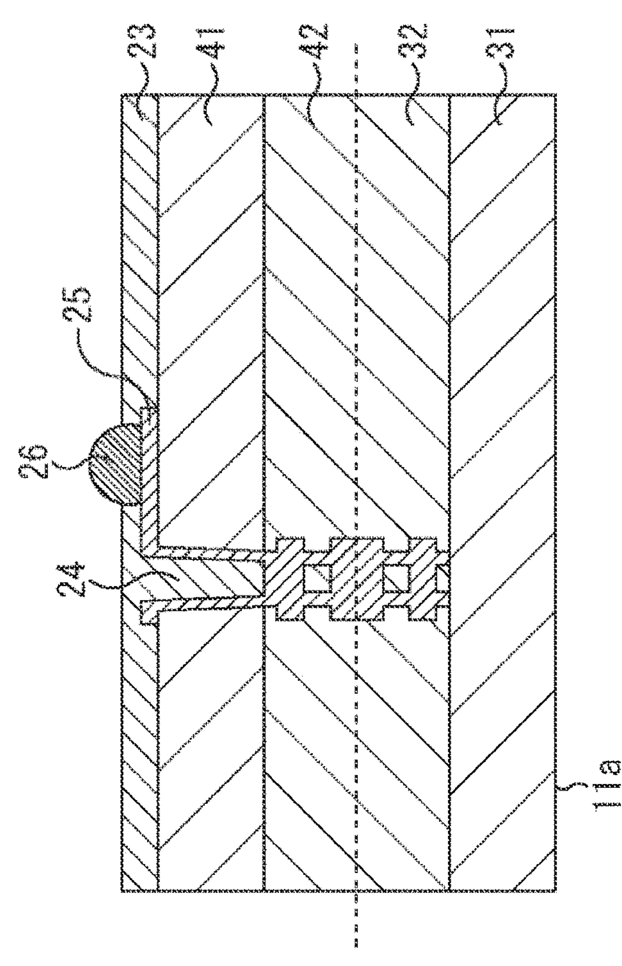
FIG. 2 is a cross-sectional view of the semiconductor device according to the first embodiment.

The upper view of FIG. 1 is a plan view illustrating a configuration example of a semiconductor device 11*a* according to a first embodiment. The lower view of FIG. 1 is a cross-sectional view illustrating a configuration example of the semiconductor device 11*a* along line X-X' in the upper view of FIG. 1. FIG. 2 is a cross-sectional view illustrating a configuration example of the semiconductor device 11*a* along line Y-Y' in the upper view of FIG. 1.

The semiconductor device 11*a* has a configuration in which a chip 21 and a chip 22 are stacked. For example, the chip 21 can be a chip on which an imaging element is mounted, and the chip 22 can be a chip on which a processing circuit that processes a signal from the chip 21 is mounted.

The chip 21 has a configuration in which a lower substrate 31 and a lower wiring layer 32 are stacked. The chip 22 has a configuration in which an upper substrate 41 and an upper wiring layer 42 are stacked. Note that, here, the chip 21 is referred to as a lower portion, the chip 22 is referred to as an upper portion, and the substrates and the wiring layers included in the chip 21 and the chip 22 are distinguished from each other and referred to as the upper substrate and wiring layer and the lower substrate and wiring layer, respectively.

In a case where the chip 21 is a chip including an imaging element, a photodiode, an on-chip lens, and the like are formed on the lower substrate 31. This lower substrate 31 can be, for example, a silicon (Si) substrate. In the lower wiring layer 32, a wiring 33 and a wiring 34 are formed in an interlayer insulating film 35. Each of the wirings 33 and 34 includes, for example, copper (Cu), aluminum (Al), tungsten (W), or the like. The interlayer insulating film 35 includes for example, a silicon oxide film, a silicon nitride film, or the like.

The upper substrate 41 of the chip 22 can be, for example, a silicon (Si) substrate. In the upper wiring layer 42, a wiring 43 and a wiring 44 are formed in an interlayer insulating film 45. Each of the wirings 43 and 44 includes, for example, copper (Cu), aluminum (Al), tungsten (W), or the like. The interlayer insulating film 45 includes for example, a silicon oxide film, a silicon nitride film, or the like.

In the semiconductor device 11*a* illustrated in FIG. 1, the wiring layers are connected to each other by metal bonding. The wiring 34 formed on the upper wiring layer 42 side of the lower wiring layer 32 and the wiring 44 formed on the lower wiring layer 32 side of the upper wiring layer 42 are connected by metal bonding.

A through hole 24 that penetrates the upper substrate 41 is formed at a predetermined location in the upper substrate 41, a connection conductor connected to the wiring 43 in the upper wiring layer 42 is formed on an inner wall of the through hole 24, and the inside of the through hole 24 is filled with an insulator including the same material as that of the insulating film 23. The insulating film 23 can include, for example, an SiO2 film, a SiN film or the like.

The connection conductor formed on the inner wall of the through hole 24 is connected to a redistribution layer 25 formed on the upper surface (in FIG. 1, the surface on the upper side, that is, the surface opposite to the surface on which the chip 21 is stacked) of the upper substrate 41. The through hole 24 is also appropriately referred to as a through electrode 24. As illustrated in the upper view of FIG. 1 and FIG. 2, a solder ball 26 is formed on the redistribution layer 25. The solder ball 26 is used for connection with a substrate, not depicted.

The semiconductor device 11*a* according to the first embodiment has a slit 27*a*. As illustrated in the upper view of FIG. 1, the slit 27*a* is formed at a predetermined location with a predetermined size and shape in plan view. The shape of the opening of the slit 27*a* may be linear (slit shape), polygonal, circular, or the like. In the following description, the case of the slit shape will be described as an example.

As illustrated in the lower view of FIG. 1, the slit 27*a* is provided down to a point where the slit 27*a* penetrates the upper wiring layer 42 and the lower wiring layer 32 in the cross-sectional view. The semiconductor device 11*a* has the slit 27*a* penetrating the upper substrate 41, the upper wiring layer 42, and the lower wiring layer 32. A stopper film 28 is formed on side surfaces of the slit 27*a* located in the upper wiring layer 42 and the lower wiring layer 32.

The semiconductor device 11*a* has a wiring layer including the upper wiring layer 42 and the lower wiring layer 32 located between the upper substrate 41 and the lower substrate 31, and is provided with the slit 27*a* that penetrates the upper substrate 41 and reaches the wiring layer. The slit 27*a* is in contact with the outside of the semiconductor device 11*a*.

By providing the slit 27*a* in contact with the outside, heat generated in the semiconductor device 11*a* can be efficiently discharged to the outside air. For example, heat generated in the lower substrate 31 is released to the outside air through the slit 27*a*. For example, some of heat generated in the lower substrate 31 is transferred to the lower substrate 31, the lower wiring layer 32, the upper wiring layer 42, and the upper substrate 41 in this order, and released to the outside air. However, heat dissipation through the slit 27*a* can more efficiently discharge heat than heat release through this path.

According to the present technology, heat generated in the semiconductor device 11*a* can be efficiently dissipated.

Second Embodiment

Figure 3:
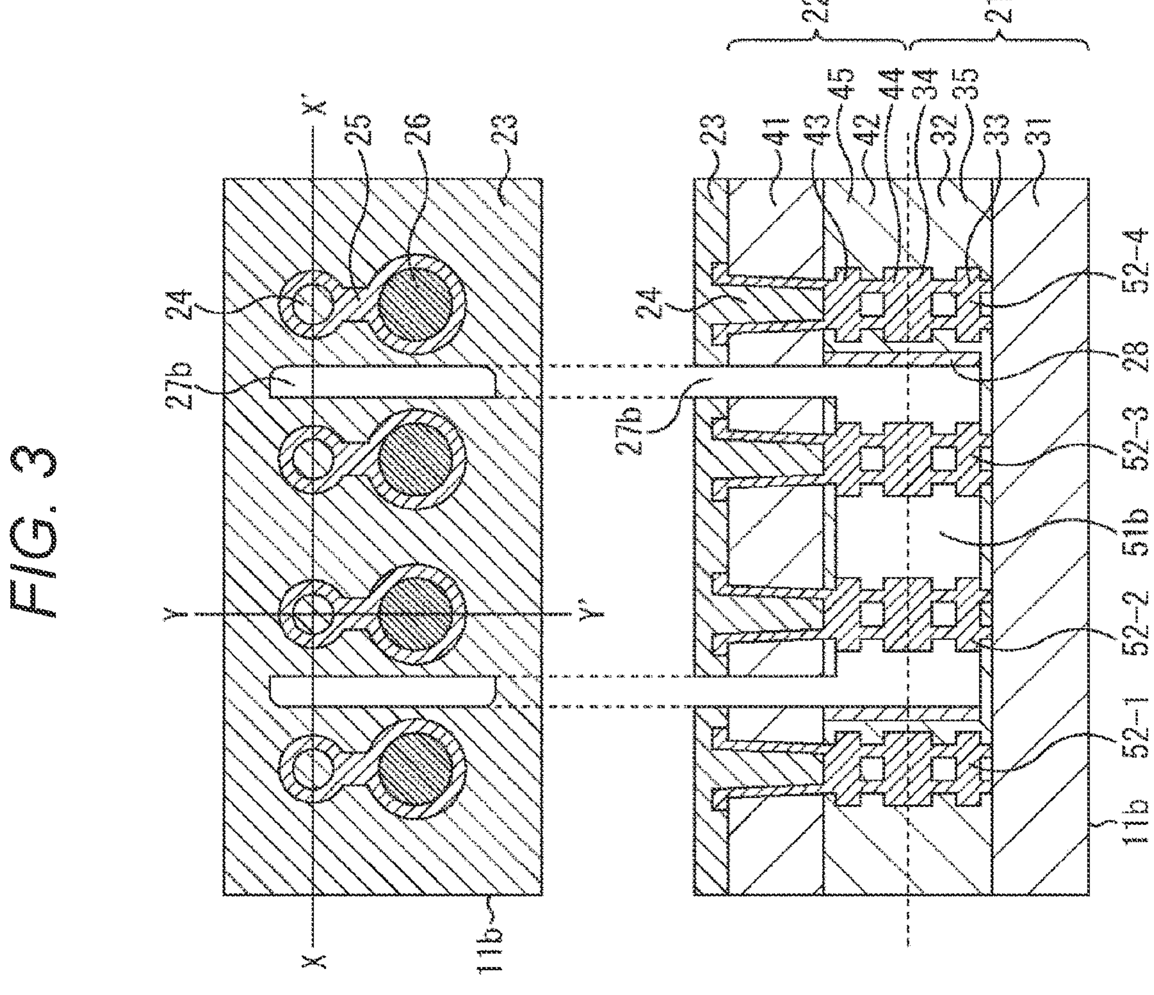
FIG. 3 is a plan view and a cross-sectional view of a semiconductor device according to a second embodiment.
Figure 4:
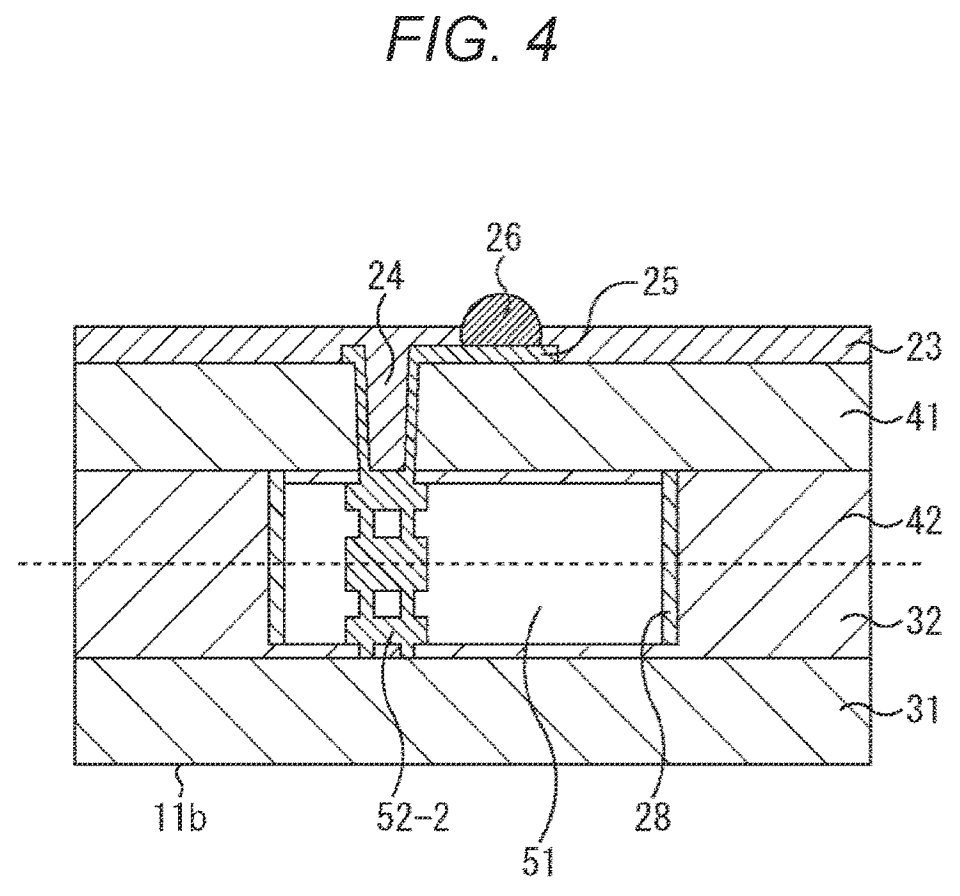

The upper view of FIG. 3 is a plan view illustrating a configuration example of a semiconductor device 11*b* according to a second embodiment. The lower view of FIG. 2 is a cross-sectional view illustrating a configuration example of the semiconductor device 11*b* along line X-X' in the upper view of FIG. 2. FIG. 4 is a cross-sectional view illustrating a configuration example of the semiconductor device 11*b* along line Y-Y' in the upper view of FIG. 3.

In the semiconductor device 11*b* according to the second embodiment, portions similar to those of the semiconductor device 11*a* according to the first embodiment are denoted by similar reference signs, and the description thereof will be appropriately omitted.

Comparing the semiconductor device 11*b* according to the second embodiment with the semiconductor device 11*a* according to the first embodiment, the semiconductor device 11*b* according to the second embodiment is different from semiconductor device 11*a* according to the first embodiment in that a gap 51*b* is provided, and the other points are similar.

The gap 51*b* is provided in the regions of a lower wiring layer 32 and an upper wiring layer 42 such that a wiring 33, a wiring 34, a wiring 43, and a wiring 44 are in contact with the gap 51*b* in a state of being exposed. Note that, here, it is described that the wiring is in contact with the gap 51*b* in a state of being exposed; however, a case where a protective film is formed on the wiring so that the wiring is not affected by moisture or the like is also included.

The side wall of the gap 51*b* is surrounded by a stopper film 28. The gap 51*b* and a slit 27*b* are integrally formed. The gap 51*b* is in contact with the outside (outside air) of the semiconductor device 11*b* via the slit 27*b*.

In the following description, the connected and integrated wiring 33, wiring 34, wiring 43, and wiring 44 will be collectively referred to as a wiring 52. FIG. 3 illustrates an example in which four wirings 52 are arranged side by side. The four wirings 52 are referred to as a wiring 52-1, a wiring 52-2, a wiring 52-3, and a wiring 52-4 in this order from the right side in the drawing.

In the semiconductor device 11*b* illustrated in FIG. 3, the four wirings 52-1 to 52-4 are arranged in the lateral direction. The gap 51*b* is formed such that the wiring 52-2 and the wiring 52-3 located at the center thereof are in contact with the gap 51*b*. The wiring 52-1 and the wiring 52-4 are formed in a state of being included in an interlayer insulating film 35 or an interlayer insulating film 45.

In the semiconductor device 11*b* illustrated in FIG. 3, an example has been illustrated in which in the gap 51*b*, two wirings 52 out of the four wirings 52 formed in the lateral direction are included in the gap 51*b*. How many of the plurality of wirings 52 formed in the lateral direction are included in the gap 51*b* is a design matter, and the number is not limited to two.

As illustrated in the lower view of FIG. 3 and FIG. 4, the gap 51*b* is surrounded by the interlayer insulating film 35 of the lower wiring layer 32 and the interlayer insulating film 45 of the upper wiring layer 42. The gap 51*b* is formed such that the side surface and the bottom surface thereof are surrounded by the interlayer insulating film 35 (45) and part of the upper surface thereof is connected to the slit 27*b*.

The semiconductor device 11*b* has a wiring layer including the upper wiring layer 42 and the lower wiring layer 32 located between an upper substrate 41 and a lower substrate 31, and is provided with the slit 27*b* that penetrates the upper substrate 41 and reaches the wiring layer. The slit 27*b* is connected to the gap 51*b* formed in the wiring layer. Since the slit 27*b* is in contact with the outside of the semiconductor device 11*b*, a structure in which also the gap 51*b* is in contact with the outside via the slit 27*b* is realized.

By forming the portion where the wiring 52 comes into contact with air, that is, the gap 51*b* in this manner, a configuration is made possible in which heat is dissipated from the wiring 52 to the gap 51*b*, and heat is discharged from the gap 51*b* to the outside of the semiconductor device 11*b* via the slit 27*b*. Therefore, heat can be dissipated more efficiently. This point will be further described with reference to FIGS. 5 and 6.

Figure 5:
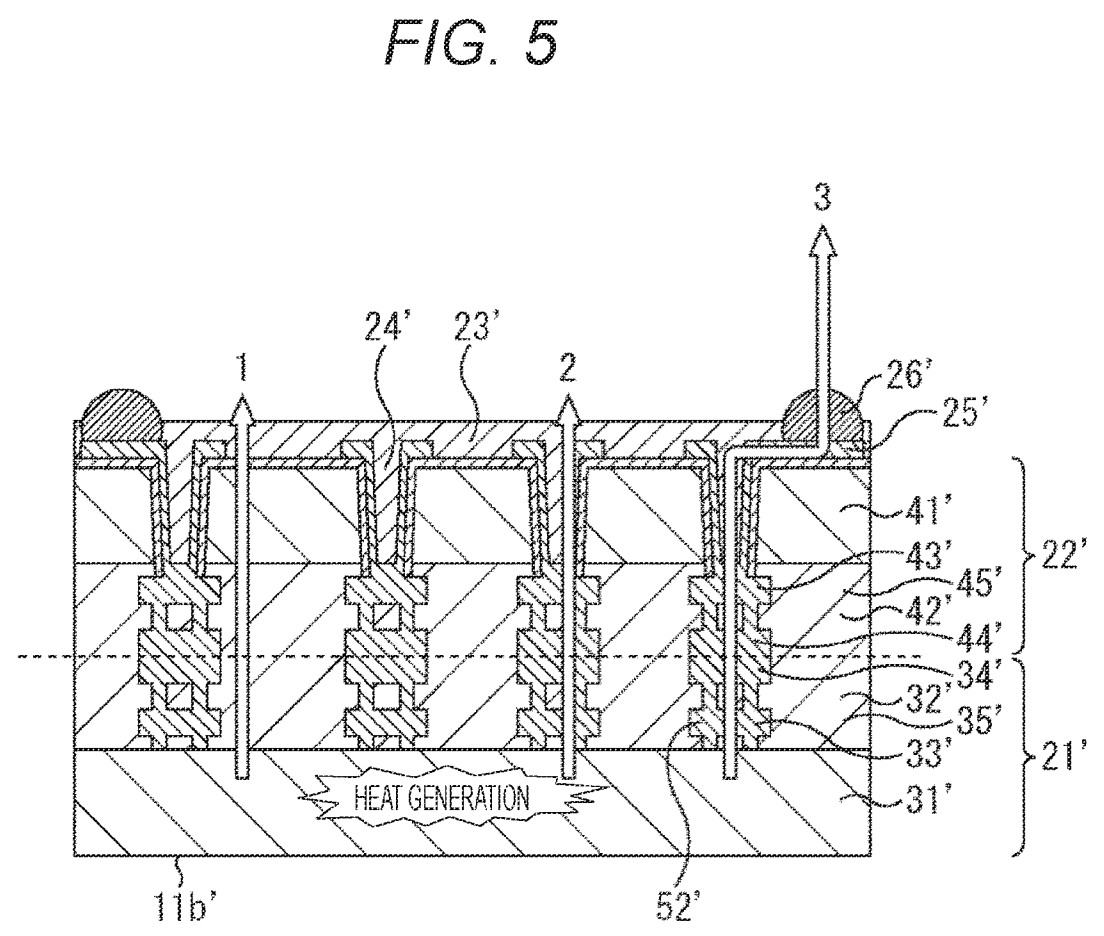

For comparison, FIG. 5 depicts a semiconductor device 11*b*' having no gap 51*b*, and a heat dissipation path will be described. The semiconductor device 11*b*' having no gap 51*b* is denoted with a dash in order to be distinguished from the semiconductor device 11*b* having the gap 51*b*.

As illustrated in FIG. 5, wirings 52-1 to 52-4 are all included in an interlayer insulating film 35' and an interlayer insulating film 45'. In the semiconductor device 11*b*' having such a configuration, three paths are conceivable as heat dissipation paths.

As a path 1, there is a path in which heat generated in a lower substrate 31' is transferred in order of a lower substrate 31'→the interlayer insulating film 35'→the interlayer insulating film 45'→an upper substrate 41' →an insulating film 23'→outside air, and the heat is dissipated.

As a path 2, there is a path in which heat generated in the lower substrate 31' is transferred in order of the lower substrate 31'→a wiring 52'→a through electrode 24'→the insulating film 23'→outside air, and the heat is dissipated.

As a path 3, there is a path in which heat generated in the lower substrate 31' is transferred in order of the lower substrate 31'→the wiring 52'→the through electrode 24'→a redistribution layer 25'→a solder ball 26'→outside air, and the heat is dissipated.

Next, heat dissipation paths in the semiconductor device 11*b* having the gap 51*b* will be described with reference to FIG. 6. In the semiconductor device 11*b* having the gap 51*b*, there are at least two more heat dissipation paths than in the semiconductor device 11*b*' (FIG. 5) having no gap 51*b*.

The paths 1 to 3 are similar to those in the case described with reference to FIG. 5, and heat is dissipated through the paths as described above.

As a path 4, there is a path in which heat generated in the lower substrate 31 is transferred in order of the lower substrate 31→the interlayer insulating film 35→the interlayer insulating film 45→the upper substrate 41→the gap 51*b* (slit 27*b*)→outside air, and the heat is dissipated.

As a path 5, there is a path in which heat generated in the lower substrate 31 is transferred in order of the lower substrate 31→the wiring 52→the gap 51*b* (slit 27*b*)→outside air, and the heat is dissipated.

In the paths 1 to 3, heat is dissipated to the outside air via the insulating film 23, whereas in the paths 4 and 5, heat is dissipated to the outside air without passing through the insulating film 23. In a case where the material used for the insulating film 23 is a material having high thermal resistance, it is highly likely that the efficiency of heat dissipation through the insulating film 23 is reduced. Since the paths 4 and 5 are paths through which heat is dissipated to the outside air without passing through the insulating film 23, the paths 4 and 5 can dissipate heat more efficiently than the paths 1 to 3 through which heat is dissipated through the insulating film 23.

Figure 6:
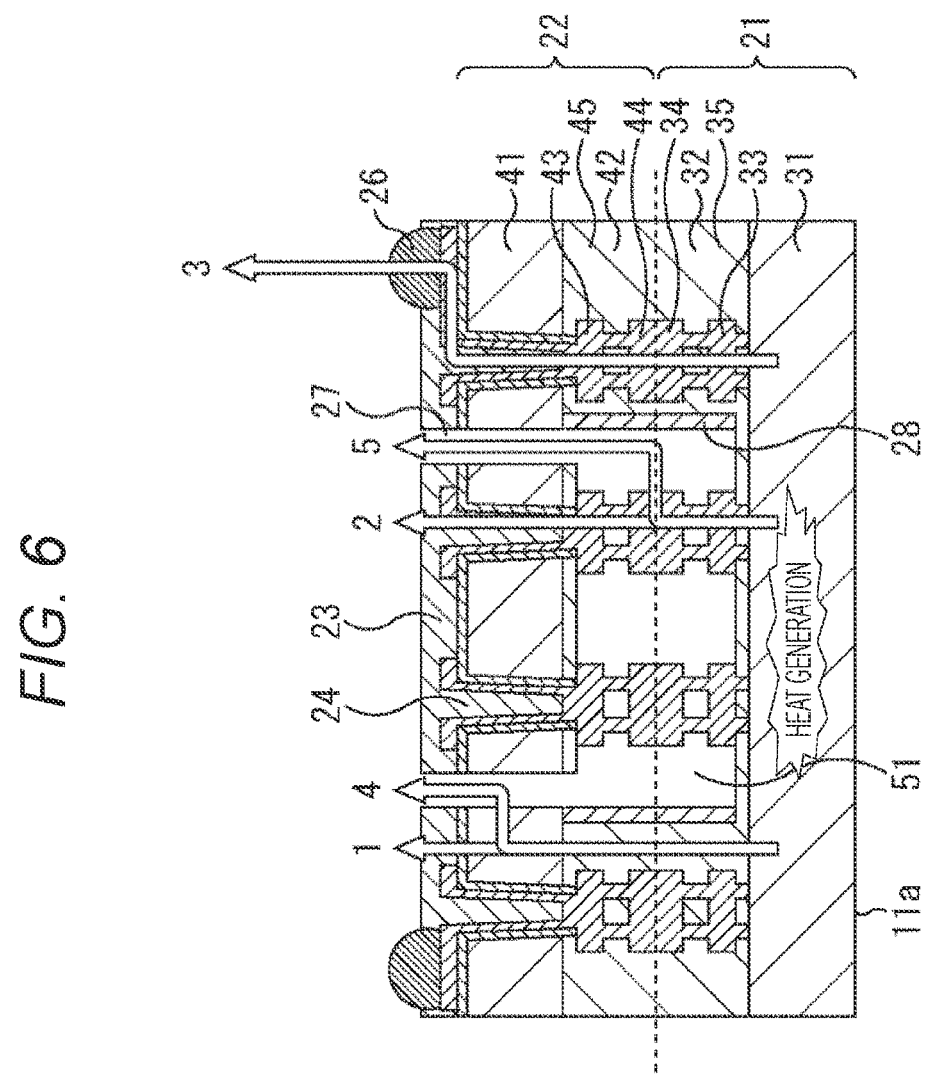

Although not illustrated in FIG. 6, there is a path through which heat generated in the lower substrate 31 is transferred from the lower substrate 31 to the gap 51*b* and dissipated to the outside air. This path can also dissipate heat to the outside air without passing through the insulating film 23 or without passing through the wiring 52 or the upper substrate 41, and thus can dissipate heat efficiently.

By providing the gap 51*b* in this manner, heat dissipation efficiency can be improved.

Third Embodiment

Figure 7:
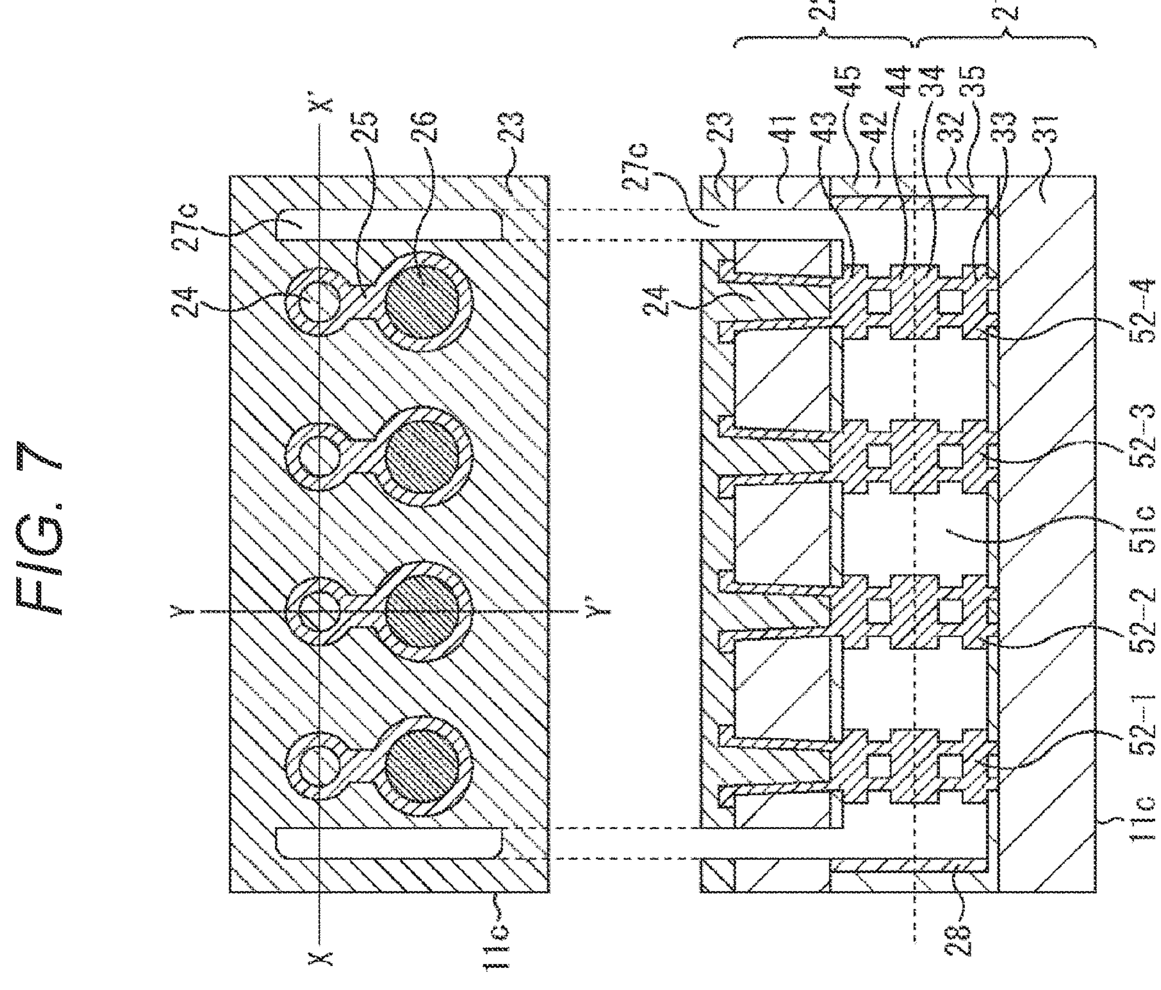
FIG. 7 is a plan view and a cross-sectional view of a semiconductor device according to a third embodiment.

The upper view of FIG. 7 is a plan view illustrating a configuration example of a semiconductor device 11*c* according to a third embodiment. The lower view of FIG. 7 is a cross-sectional view illustrating a configuration example of the semiconductor device 11*c* along line X-X' in the upper view of FIG. 7. The cross-sectional view of the semiconductor device 11*c* taken along line Y-Y' in the upper view of FIG. 7 is similar to the cross-sectional view of the semiconductor device 11*b* illustrated in FIG. 4, and thus illustration is omitted.

In the semiconductor device 11*c* according to the third embodiment, portions similar to those of the semiconductor device 11*b* according to the second embodiment are denoted by similar reference signs, and the description thereof will be appropriately omitted.

Comparing the semiconductor device 11*c* according to the third embodiment with the semiconductor device 11*b* according to the second embodiment, the semiconductor device 11*c* according to the third embodiment is different from the semiconductor device 11*b* according to the second embodiment in that a gap 51*c* greater than the gap 51*b* of the semiconductor device 11*b* according to the second embodiment is provided, and the other points are similar.

Wirings 52-1 to 52-4 arranged in the lateral direction of the semiconductor device 11*c* according to the third embodiment are provided so as to be located in the gap 51*c*. The gap 51*c* is formed in the entire region where the wiring 52 is formed in the semiconductor device 11*c*. In this manner, by adopting a configuration is which all the arranged wirings 52 are formed so as to be in contact with the gap 51*c*, the area of the wirings 52 in contact with the outside air can be increased, and heat dissipation efficiency can be further improved.

Some of the arranged wirings 52 may be included in the gap 51*b* as in the semiconductor device 11*b* according to the second embodiment, or all of the arranged wirings 52 may be included in the gap 51*c* as in the semiconductor device 11*c* according to the third embodiment. The number of wiring 52 included in the gap 51 is not limited, and may be any number.

By providing the gap 51*b* in this manner, heat dissipation efficiency can be improved.

Fourth Embodiment

Figure 8:
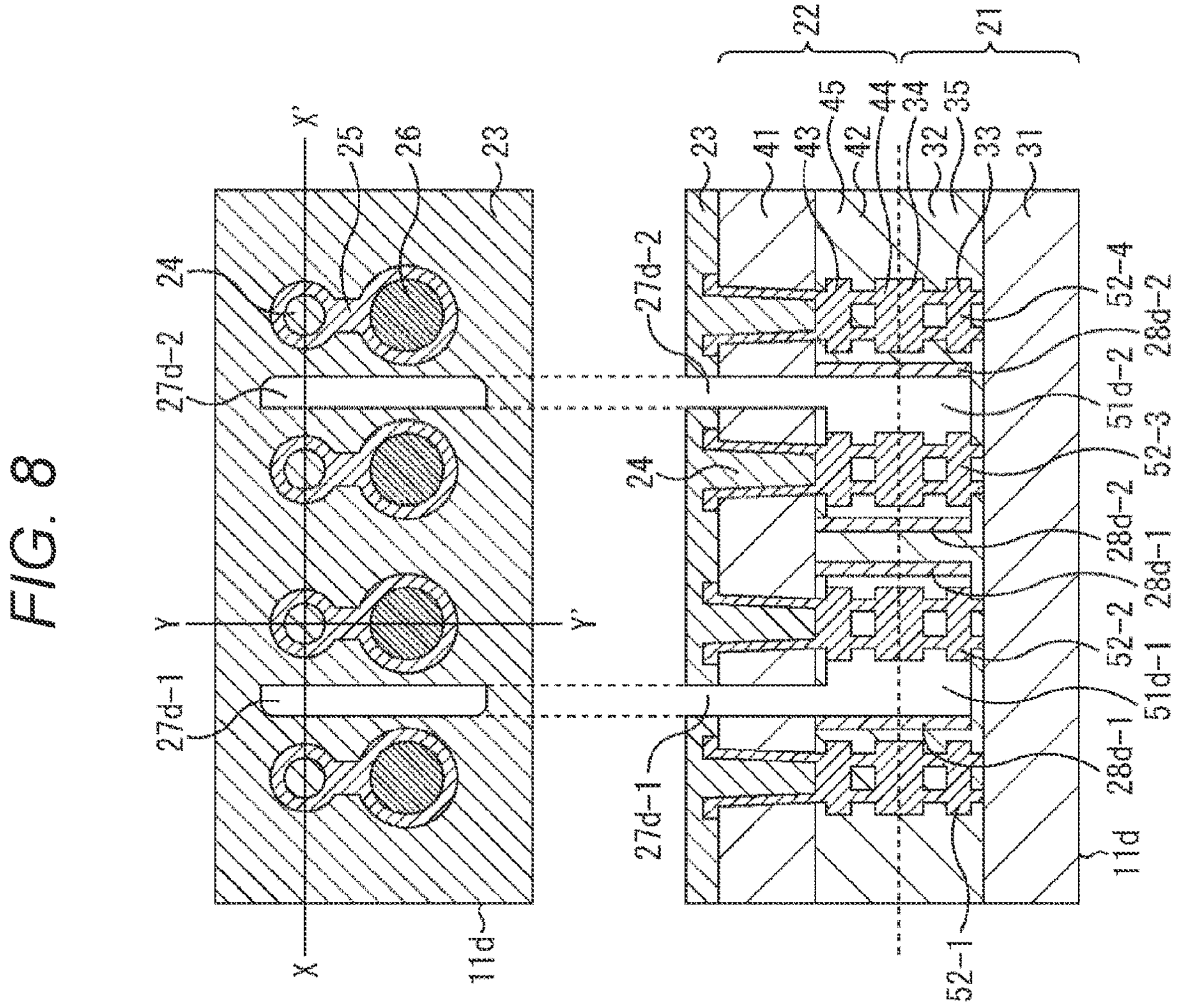
FIG. 8 is a plan view and a cross-sectional view of a semiconductor device according to a fourth embodiment.

The upper view of FIG. 8 is a plan view illustrating a configuration example of a semiconductor device 11*d* according to a fourth embodiment. The lower view of FIG. 8 is a cross-sectional view illustrating a configuration example of the semiconductor device 11*d* along line X-X' in the upper view of FIG. 8. The cross-sectional view of the semiconductor device 11*d* taken along line Y-Y' in the upper view of FIG. 8 is similar to the cross-sectional view of the semiconductor device 11*b* illustrated in FIG. 4, and thus illustration is omitted.

In the semiconductor device 11*d* according to the fourth embodiment, portions similar to those of the semiconductor device 11*b* according to the second embodiment are denoted by similar reference signs, and the description thereof will be appropriately omitted.

Comparing the semiconductor device 11*d* according to the fourth embodiment with the semiconductor device 11*b* according to the second embodiment, the semiconductor device 11*d* according to the fourth embodiment is different from the semiconductor device 11*b* according to the second embodiment in that a gap 51*d* is provided for each wiring 52, and the other points are similar.

In the semiconductor device 11*c* illustrated in FIG. 8, a gap 51*d*-1 is formed in a wiring 52-2, and a gap 51*d*-2 is formed in a wiring 52-3. A stopper film 28*d*-1 is formed on an inner wall of the gap 51*d*-1, and a stopper film 28*d*-2 is formed on an inner wall of the gap 51*d*-2.

A slit 27 is also formed for each wiring 52. The gap 51*d*-1 is connected to and integrated with a slit 27*d*-1. The gap 51*d*-2 is connected to and integrated with a slit 27*d*-2.

As described above, by providing the gap 51*d* and the slit 27*d* for each wiring 52, heat can be dissipated to the outside air for each wiring 52, and heat dissipation efficiency can be further improved.

In the semiconductor device 11*d* illustrated in FIG. 8, an example in which among the wirings 52-1 to 52-4 arranged side by side, the gap 51*d* is provided in each of the wiring 52-2 and the wiring 52-3 is illustrated; however, the gap 51*d* can also be provided in each of the wiring 52-1 and the wiring 52-4.

As described in the second to fourth embodiments, a plurality of wirings 52 can be included in one gap 51*d* as in the semiconductor device 11*b* according to the second embodiment and the semiconductor device 11*c* according to the third embodiment, or one wiring 52 can be included in one gap 51*d* as in the semiconductor device 11*d* according to the fourth embodiment.

As compared with a case where a plurality of wirings 52 is included in one gap 51*d* as in the semiconductor device 11*b* according to the second embodiment and the semiconductor device 11*c* according to the third embodiment, the strength of the semiconductor device 11 can be increased by adopting a configuration in which one wiring 52 is included in one gap 51*d* as in the semiconductor device 11*d* according to the fourth embodiment.

Fifth Embodiment

Figure 9:
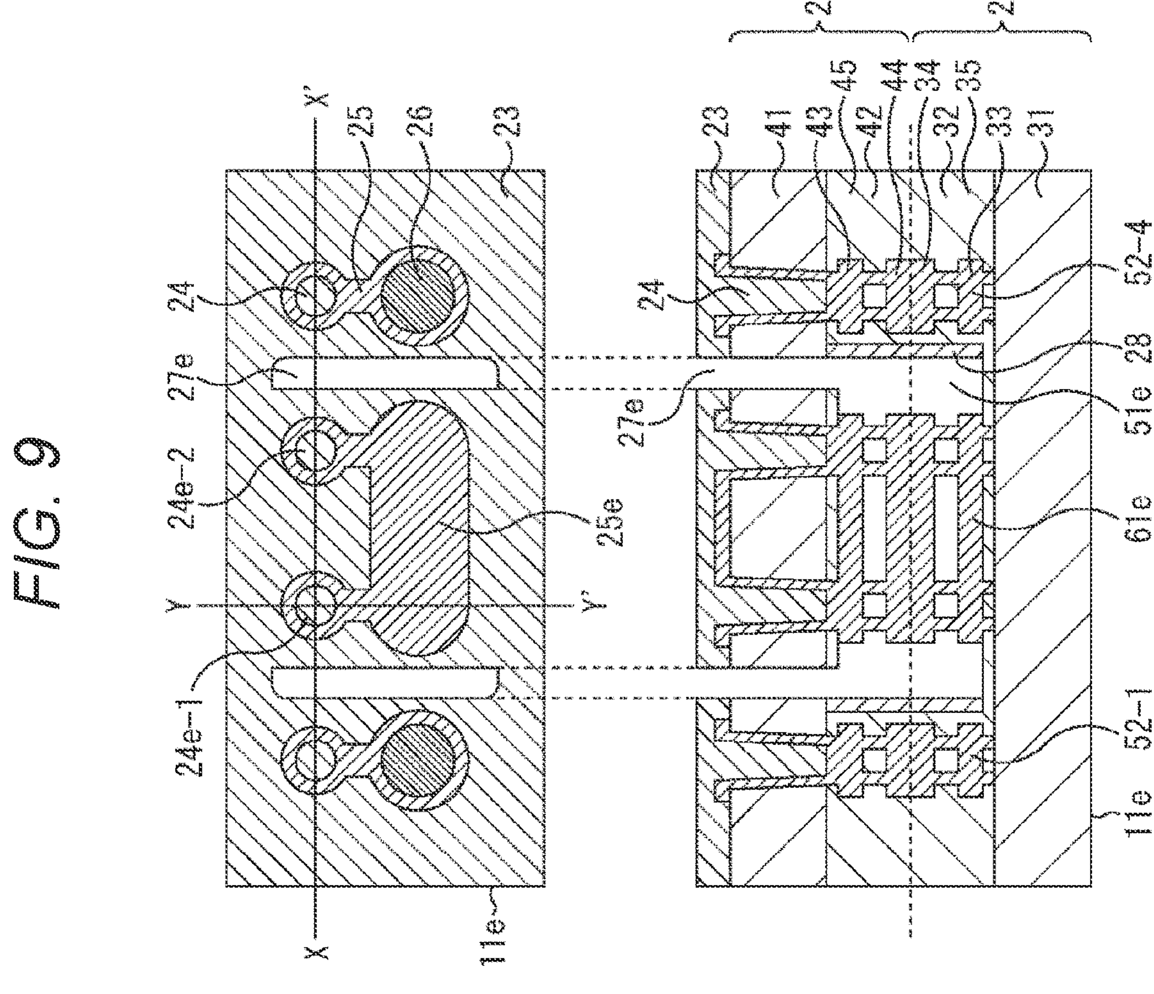
FIG. 9 is a plan view and a cross-sectional view of a semiconductor device according to a fifth embodiment.
Figure 10:
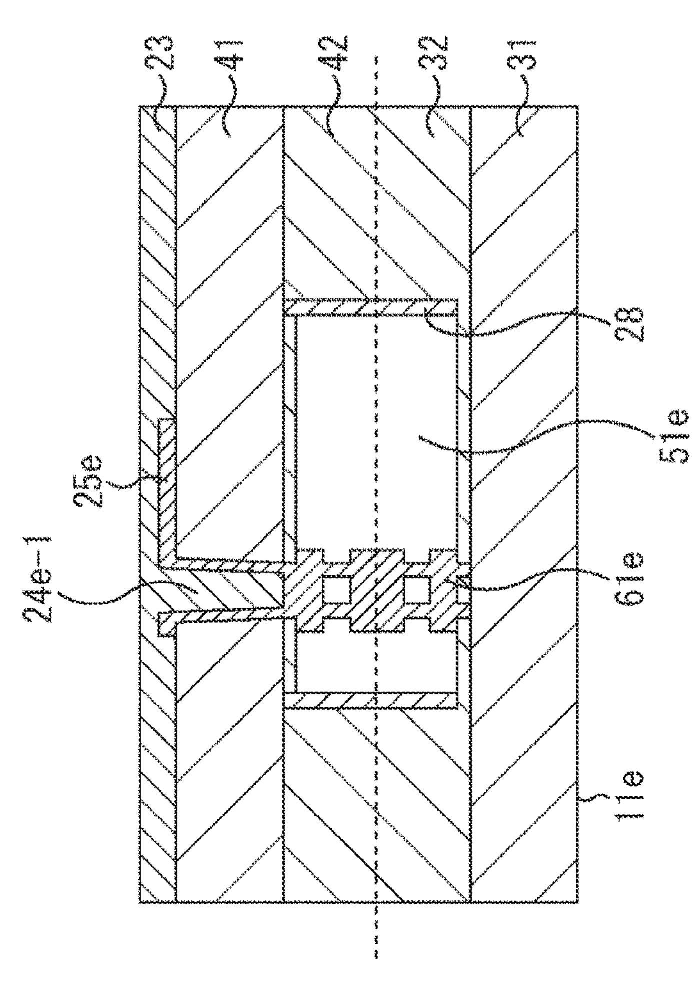
FIG. 10 is a cross-sectional view of the semiconductor device according to the fifth embodiment.

The upper view of FIG. 9 is a plan view illustrating a configuration example of a semiconductor device 11*e* according to a fifth embodiment. The lower view of FIG. 9 is a cross-sectional view illustrating a configuration example of the semiconductor device 11*e* along line X-X' in the upper view of FIG. 9. FIG. 10 is a cross-sectional view illustrating a configuration example of the semiconductor device 11*e* along line Y-Y' in the upper view of FIG. 9.

In the semiconductor device 11*e* according to the fifth embodiment, portions similar to those of the semiconductor device 11*b* according to the second embodiment are denoted by similar reference signs, and the description thereof will be appropriately omitted.

The semiconductor device 11*e* according to the fifth embodiment is different from the semiconductor device 11*b* according to the second embodiment in that a wiring 52 formed at a gap 51*e* is a dummy wiring 61*e*. As illustrated in the lower view of FIG. 9, the dummy wiring 61*e* is formed in the gap 51*e* of the semiconductor device 11*e*.

The dummy wiring 61*e* is formed in a region where the gap 51*e* is provided, and is a wiring that is not used to supply a voltage or exchange a signal, unlike the other wirings 52. Since the dummy wiring 61*e* does not need to be connected to another substrate, a solder ball 26 can be omitted as illustrated in FIG. 10. It is needless to say that a solder ball 26 connected to the dummy wiring 61*e* may be provided.

As illustrated in the upper view of FIG. 9, a redistribution layer 25*e* may be formed to be large. In the example illustrated in the upper view of FIG. 9, the redistribution layer 25*e* is connected to two through electrodes 24*e*-1 and 24*e*-2, and is formed in a larger shape than the redistribution layer 25 illustrated in the upper view of FIG. 3, for example. Since the redistribution layer 25 is a portion in contact with the outside air, by forming such a portion to be large, it is possible to improve the efficiency of dissipating heat that has conducted via the dummy wiring 61*e* to the outside air in the redistribution layer 25.

By also forming the dummy wiring 61*e* itself so as to have a large area in contact with the gap 51*e*, heat dissipation to the gap 51*e* can be more efficiently performed. As illustrated in the lower view of FIG. 9, the dummy wiring 61*e* has, for example, a shape in which a wiring corresponding to the wiring 52-2 and the wiring 52-3 illustrated in the lower view of FIG. 2 are connected, and has a structure in which a portion connecting the wirings 52 is provided and the portion is also in contact with the gap 51*e*. As described above, the dummy wiring 61*e* has a shape in which the area in contact with the gap 51*e* increases, and has a shape that enhances heat dissipation efficiency.

By providing the gap 51*e* and the dummy wiring 61*e* in this manner, heat dissipation efficiency can be improved.

Sixth Embodiment

Figure 11:
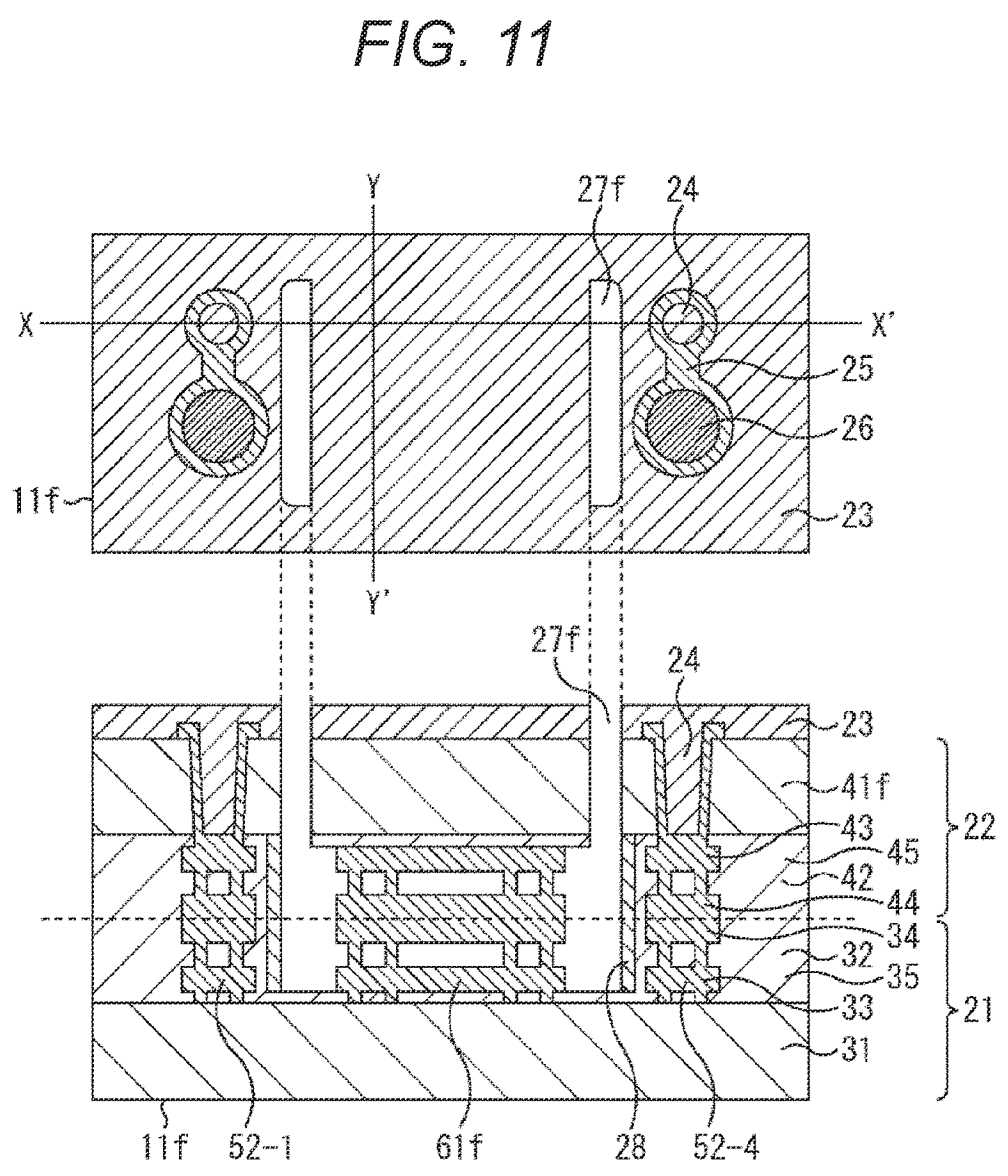
Figure 12:
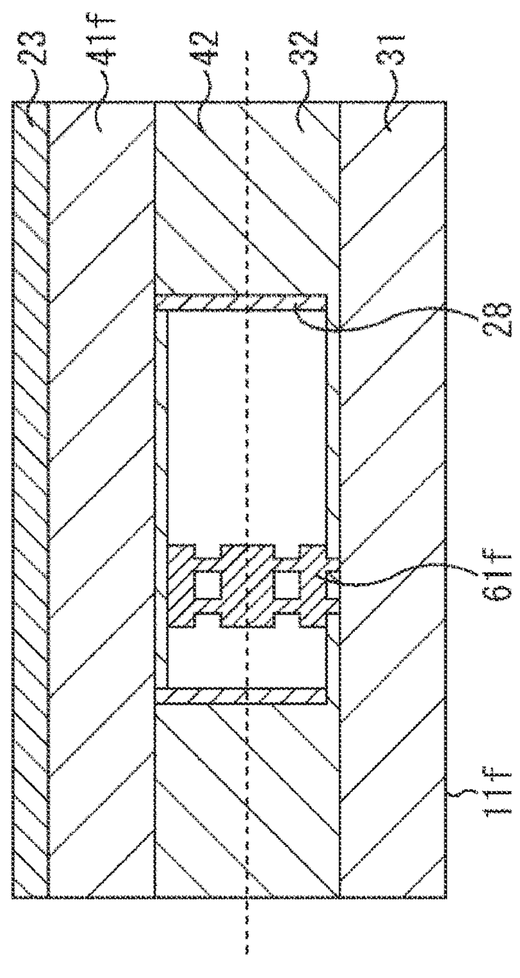
FIG. 12 is a cross-sectional view of the semiconductor device according to the sixth embodiment.

The upper view of FIG. 11 is a plan view illustrating a configuration example of a semiconductor device 11*f* according to a sixth embodiment. The lower view of FIG. 11 is a cross-sectional view illustrating a configuration example of the semiconductor device 11*f* along line X-X' in the upper view of FIG. 11. FIG. 12 is a cross-sectional view illustrating a configuration example of the semiconductor device 11*f* along line Y-Y' in the upper view of FIG. 11.

In the semiconductor device 11*f* according to the sixth embodiment, portions similar to those of the semiconductor device 11*e* according to the fifth embodiment are denoted by similar reference signs, and the description thereof will be appropriately omitted.

The semiconductor device 11*f* according to the sixth embodiment is different from the semiconductor device 11*e* according to the fifth embodiment in that the through electrode 24 and the redistribution layer 25 are removed from the semiconductor device 11*e* according to the fifth embodiment.

The semiconductor device 11*f* includes a dummy wiring 61*f*. Since the dummy wiring 61*f* is provided, a solder ball 26 for external connection, a redistribution layer 25 on which the solder ball 26 is formed, and a through electrode 24 for connecting the redistribution layer 25 and the dummy wiring 61*f* may not be provided.

Since an upper substrate 41 on the dummy wiring 61*f*, in other words, the upper substrate 41 between adjacent slits 27*f* can be a region without the through electrode 24, a circuit can be arranged in this region, and the degree of freedom in layout can be increased.

Also in the semiconductor device 11*f* according to the sixth embodiment, the dummy wiring 61*f* and a gap 51*f* have a large area in contact with each other, and heat can be efficiently dissipated to the outside air.

The fourth or fifth embodiment can also be implemented in combination with any of the first to fourth embodiments. For example, a configuration can also be adopted in which the second embodiment and the fifth embodiment are combined to form a gap 51 at each of the wiring 52 and the dummy wiring 61.

Seventh Embodiment

Figure 13:
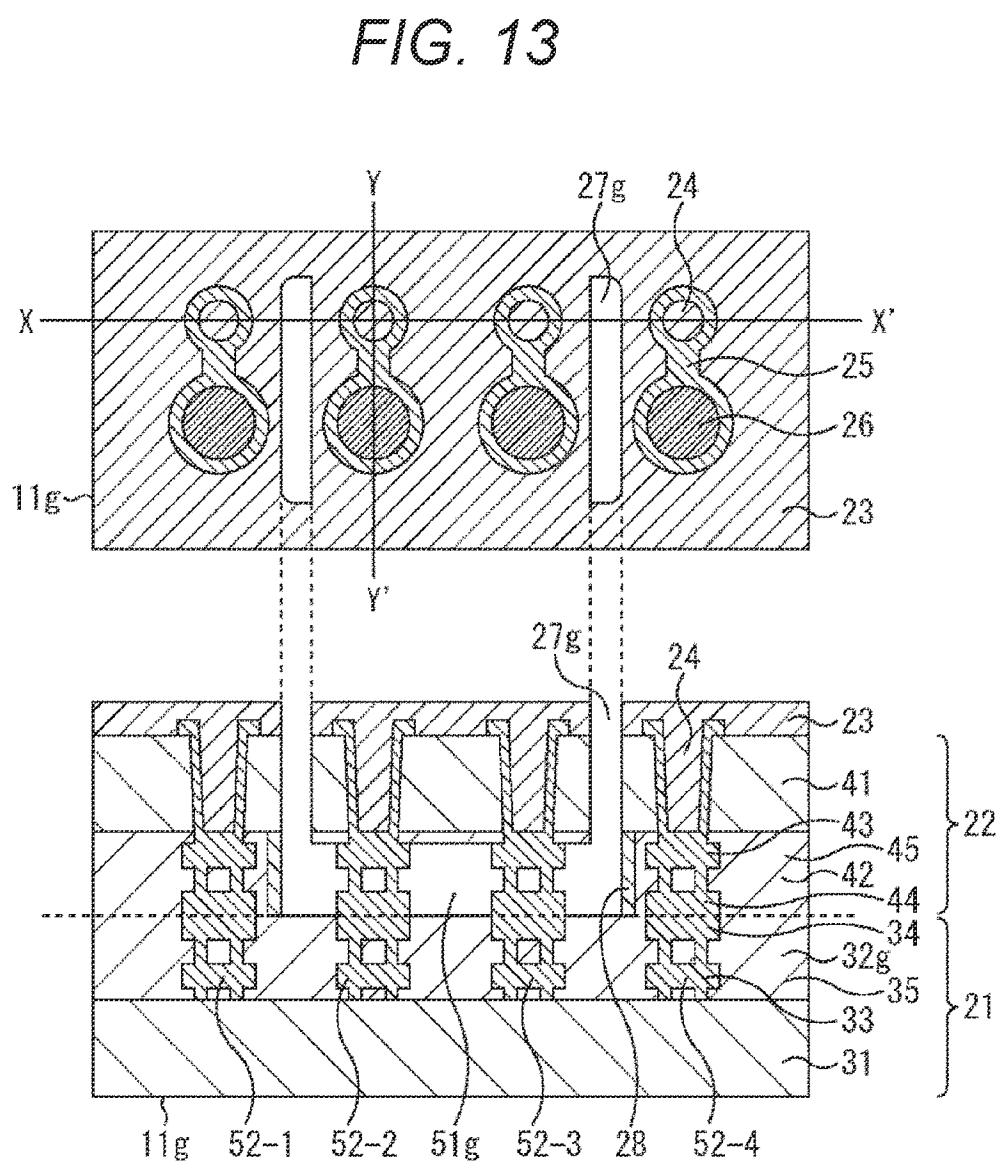
Figure 14:
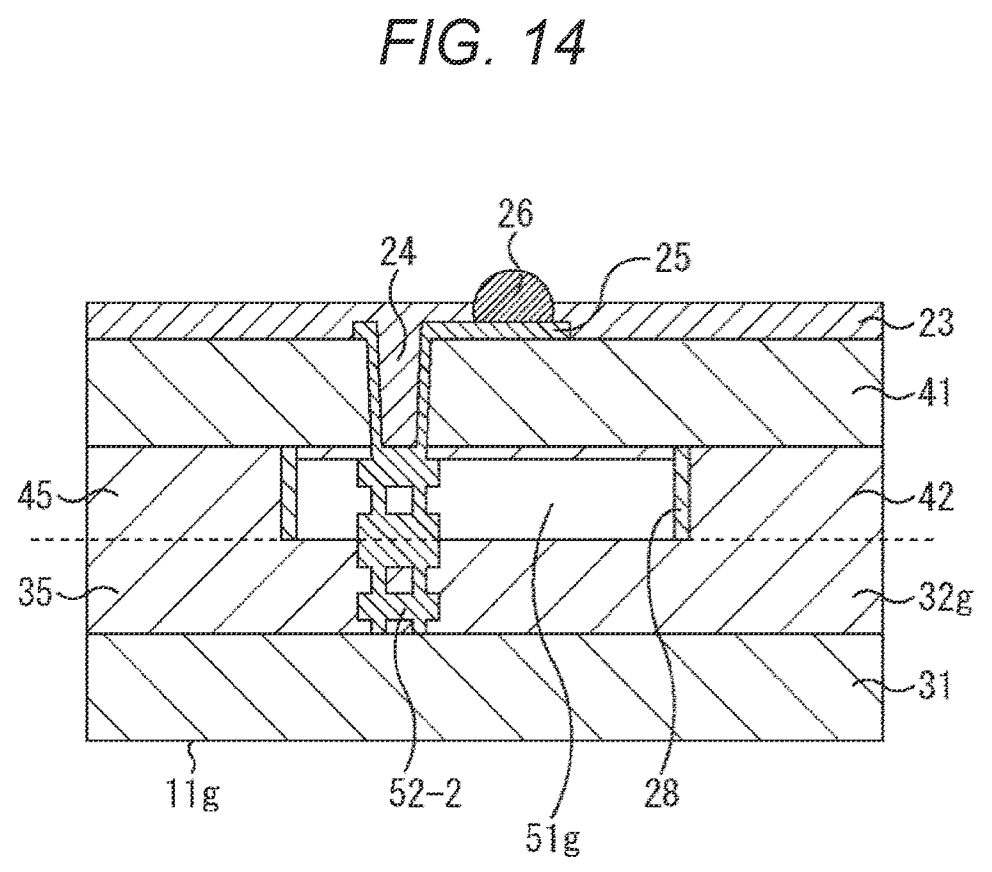

The upper view of FIG. 13 is a plan view illustrating a configuration example of a semiconductor device 11*g* according to a seventh embodiment. The lower view of FIG. 13 is a cross-sectional view illustrating a configuration example of the semiconductor device 11*g* along line X-X' in the upper view of FIG. 13. FIG. 14 is a cross-sectional view illustrating a configuration example of the semiconductor device 11*g* along line Y-Y' in the upper view of FIG. 13.

In the semiconductor device 11*g* according to the seventh embodiment, portions similar to those of the semiconductor device 11*b* according to the second embodiment are denoted by similar reference signs, and the description thereof will be appropriately omitted.

The gap 51 in each of the semiconductor devices 11*a* to 11*f* according to the first to sixth embodiments is an example in which the gap 51 is formed as a space extending over both the lower wiring layer 32 and the upper wiring layer 42. However, as in the semiconductor device 11*g* in the seventh embodiment, a gap 51*g* can be formed only on the upper wiring layer 42 side.

A wiring 52-2 and a wiring 52-3 of the semiconductor device 11*g* illustrated in FIG. 13 are partially in contact, that is, are not entirely in contact with the gap 51*g*. The upper sides of the wiring 52-2 and the wiring 52-3 are formed in the gap 51*g*, and the lower sides of the wiring 52-2 and the wiring 52-3 are formed in an interlayer insulating film 35 of a lower wiring layer 32*g*.

In this case, since the gap 51*g* is formed only on the chip 22 side, a step of forming the gap 51*g* only on the chip 22 side is included at the time of manufacturing, and the step of forming the gap 51*g* on the chip 21 side can be eliminated. Therefore, the number of steps can be reduced, and the manufacturing cost of the semiconductor device 11*g* can be reduced.

Also in the semiconductor device 11*g*, heat that has conducted through the wiring 52-2 and the wiring 52-3 can be released to the outside air through the gap 51*g* and a slit 27*g*, so that heat dissipation efficiency can be improved.

The seventh embodiment can be implemented in combination with any of the first to sixth embodiments described above.

<Manufacturing Steps>

The manufacture of the semiconductor devices 11 according to the first to seventh embodiments will be described with reference to FIGS. 15 and 16.

In step S11, the chip 21 and the chip 22 on which the wiring 52 is formed are prepared. In the lower wiring layer 32 of the chip 21, a portion to be part of the wiring 52 is formed, and the stopper films 28 are formed at both ends of the region where the gap 51 is to be formed. Similarly, in the upper wiring layer 42 of the chip 22, a portion to be part of the wiring 52 is formed, and the stopper films 28 are formed at both ends of the region where the gap 51 is to be formed.

Note that, in the case of manufacturing the semiconductor device 11*g* according to the seventh embodiment, since the gap 51 is not formed in the chip 21, no stopper film 28 is formed in the chip 21. A film, not depicted, such as a protective film may be formed around the wiring 52.

Although depicted in a simplified manner in FIG. 13, in step S11, processing is repeated so as to obtain a desired shape and size of the wiring 52.

In step S12, the chip 21 and the chip 22 are connected by Cu—Cu connection. In step S13, the upper substrate 41 of the chip 22 is thinned by grinding with a grinder or the like or wet etching.

In step S14 (FIG. 16), the through hole 24 is formed in the upper substrate 41, and the connection conductor is formed on the side wall of the through hole 24. In step S15, the gap 51 and the slit 27 are formed. The above-described semiconductor device 11 is manufactured through a step of forming the redistribution layer 25 and forming the insulating film 23 on the upper substrate 41 as a subsequent step, not depicted.

Figure 17:
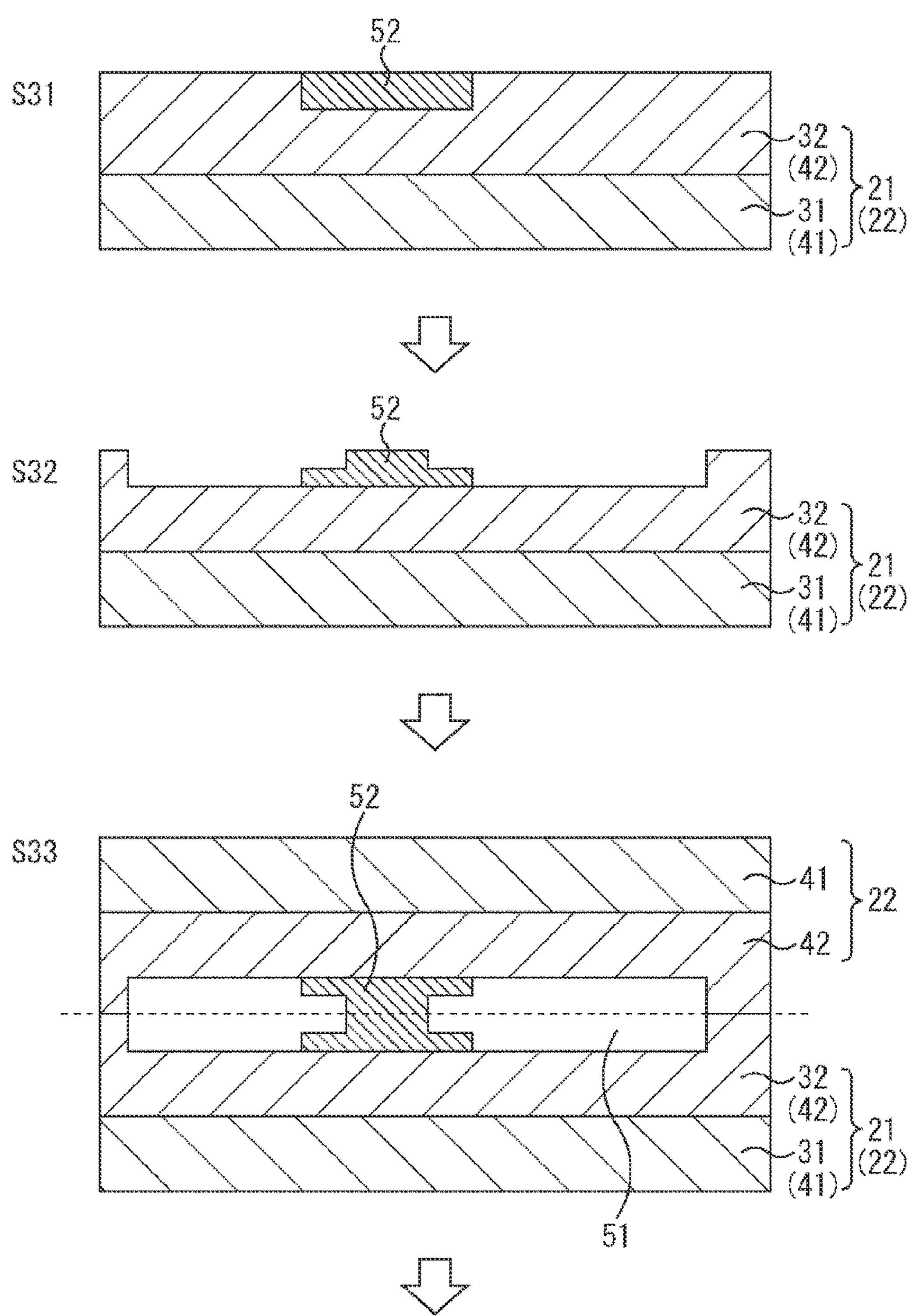
FIG. 17 is a view for explaining manufacturing of the semiconductor device.
Figure 18:
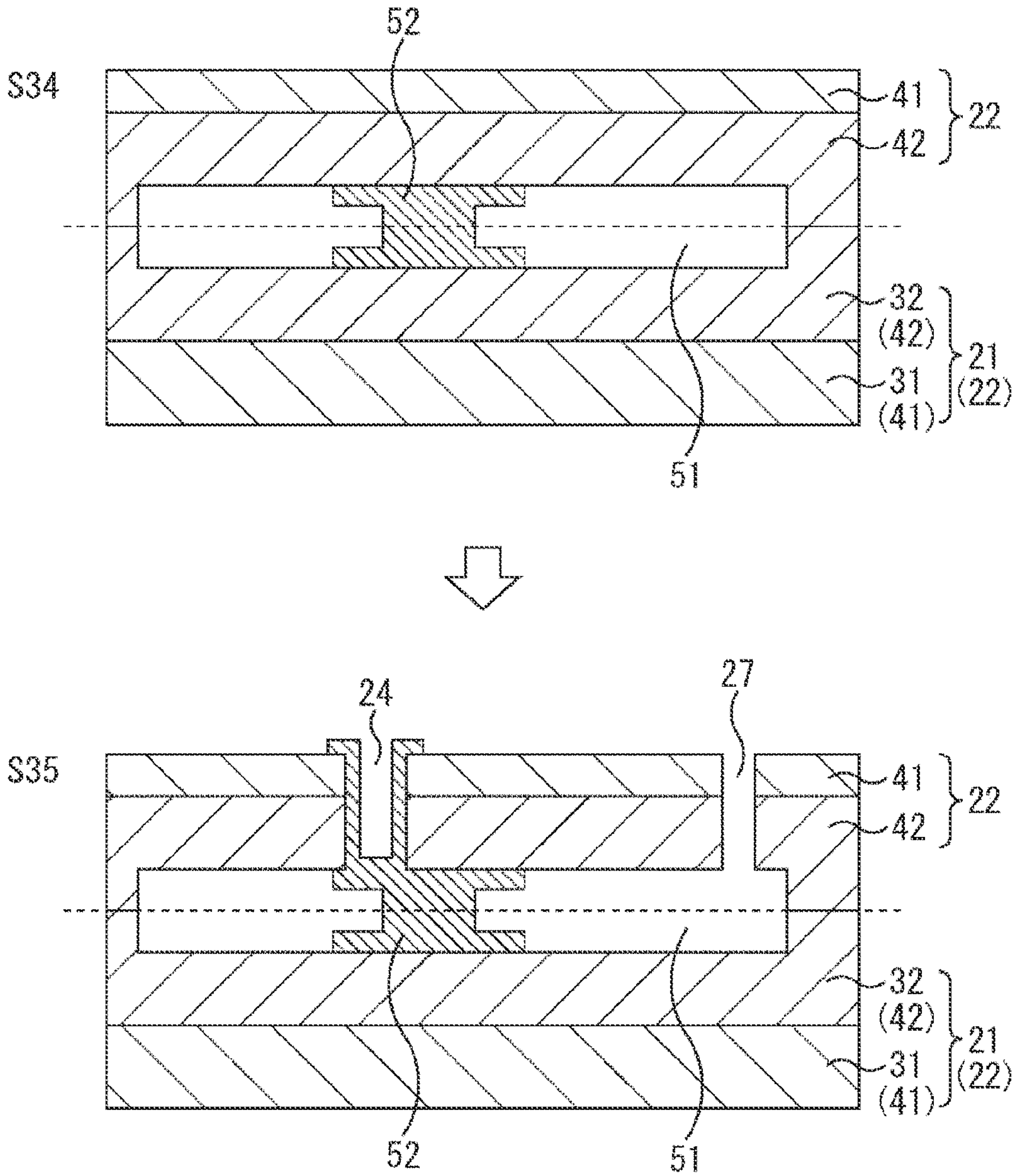
FIG. 18 is a view for explaining manufacturing of the semiconductor device.

Other manufacturing steps of the semiconductor device 11 will be described with reference to FIGS. 17 and 18.

In step S31 (FIG. 17), the chip 21 and the chip 22 on which the wiring 52 is formed are prepared. In the lower wiring layer 32 of the chip 21, a portion to be part of the wiring 52 is formed. Similarly, in the upper wiring layer 42 of the chip 22, a portion to be part of the wiring 52 is formed.

In step S32, lithography and dry etching are performed on the chip 21 and the chip 22 so that a portion to be the gap 51 is processed. In step S32, a plurality of times of lithography and dry etching is performed so as to obtain the shape and size of the wiring 52.

Since the gap 51 is formed by lithography and dry etching, it is not necessary to form the stopper film 28. In the above description, the case where the stopper film 28 is provided has been described as an example; however, in a case where the semiconductor device 11 described above is manufactured in these manufacturing steps, a configuration without the stopper film 28 can be adopted.

In step S33, the chip 21 and the chip 22 are connected by Cu—Cu connection. In step S34 (FIG. 18), the upper substrate 41 of the chip 22 is thinned by grinding with a grinder or the like or wet etching.

In step S35, the through hole 24 and the slit 27 are formed in the upper substrate 41, and the connection conductor is formed on the side wall of the through hole 24. The above-described semiconductor device 11 is manufactured through a step of forming the redistribution layer 25 and forming the insulating film 23 on the upper substrate 41 as a subsequent step, not depicted.

The gap 51 and the slit 27 are formed at predetermined locations in predetermined sizes and shapes in accordance with the semiconductor devices 11 according to the first to seventh embodiments described above.

Eighth Embodiment

Figure 19:
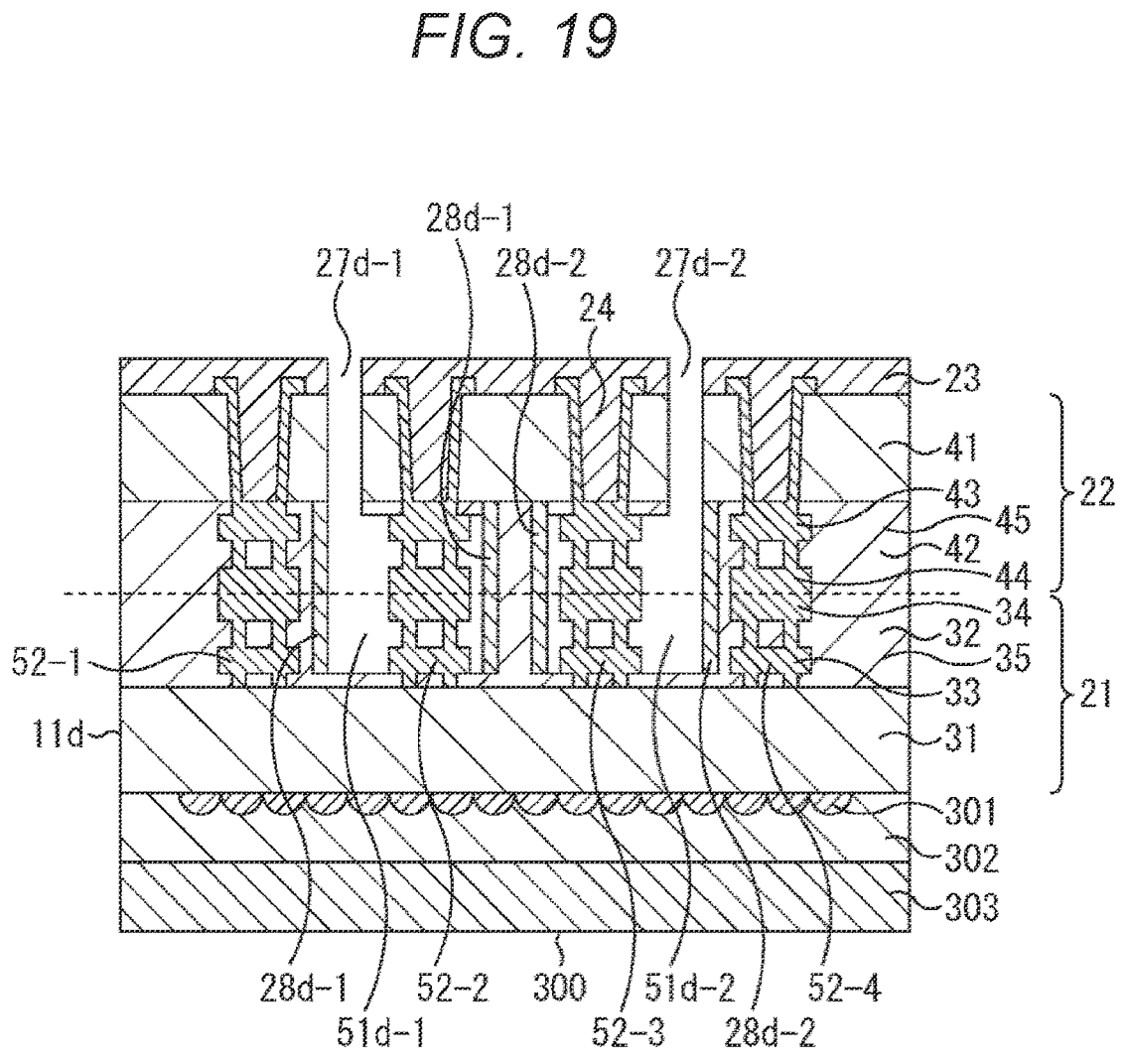

As an eighth embodiment, a case where any of the semiconductor devices 11 of the first to seventh embodiments is applied to an imaging element will be described. FIG. 19 is a view illustrating a configuration example in a case where the semiconductor device 11*d* (FIG. 8) according to the fourth embodiment is applied to an imaging element.

A chip 21 included in an imaging element 300 is used as a back-illuminated solid-state imaging element. A photodiode (PD) is formed on a lower substrate 31 of the chip 21, and an on-chip lens 301 is formed on the light incident surface side. An adhesive 302 is disposed on at least part of the surface of the lower substrate 31 on the side where the on-chip lens 301 is formed, and a transparent substrate 303 is stacked.

A chip 22 is stacked on the chip 21 as the solid-state imaging element. The chip 22 can be a chip on which a processing circuit for processing a signal obtained from the solid-state imaging element and a memory are formed.

Although not depicted in FIG. 19, as illustrated in the upper view of FIG. 8, a redistribution layer 25 is formed, and a solder ball 26 is formed on the redistribution layer 25. The solder ball 26 is used for connection when another chip or the like is stacked.

Since the imaging element 300 includes the semiconductor device 11*c*, and the semiconductor device 11*c* has a configuration with improved heat dissipation efficiency as described above, the imaging element 300 itself can also have a configuration with improved heat discharge efficiency.

<Configuration of Electronic Apparatus>

The imaging element 300 illustrated in FIG. 19 can be applied to various electronic apparatuses, for example, an imaging device such as a digital still camera and a digital video camera, a mobile phone with an imaging function, or other apparatuses having an imaging function.

Figure 20:
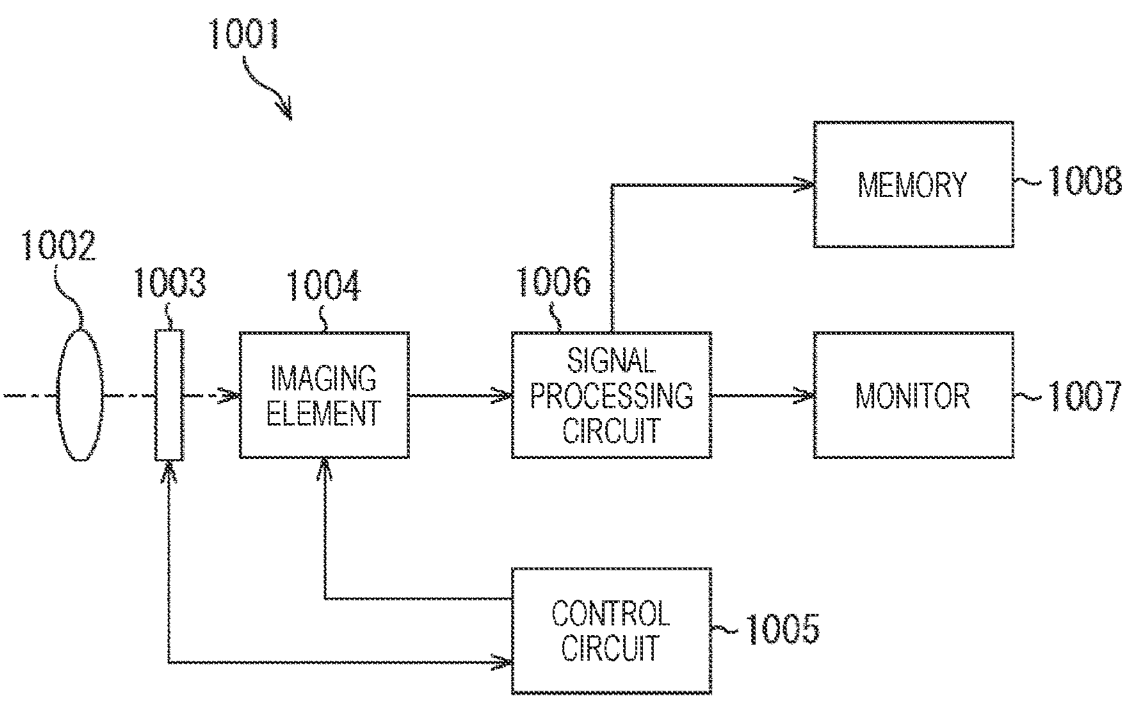
FIG. 20 is a diagram illustrating an example of an electronic apparatus.

FIG. 20 is a block diagram illustrating a configuration example of the imaging device as the electronic apparatus. An imaging device 1001 illustrated in FIG. 20 includes an optical system 1002, a shutter device 1003, an imaging element 1004, a drive circuit 1005, a signal processing circuit 1006, a monitor 1007, and a memory 1008, and can capture still images and moving images.

The optical system 1002 has one or a plurality of lenses, and guides light (incident light) from a subject to the imaging element 1004 and forms an image on a light receiving surface of the imaging element 1004.

The shutter device 1003 is arranged between the optical system 1002 and the imaging element 1004, and controls a light irradiation period and a shading period with respect to the imaging element 1004 in accordance with the control of the drive circuit 1005.

The imaging element 1004 includes a package including the above-described imaging element. The imaging element 1004 accumulates signal charges for a certain period of time in accordance with light formed as an image on the light receiving surface via the optical system 1002 and the shutter device 1003. The signal charges accumulated in the imaging element 1004 are transferred in accordance with a driving signal (timing signal) supplied from the drive circuit 1005.

The drive circuit 1005 outputs a driving signal for controlling a transfer operation of the imaging element 1004 and a shutter operation of the shutter device 1003 to drive the imaging element 1004 and the shutter device 1003.

The signal processing circuit 1006 performs various kinds of signal processing on the signal charges output from the imaging element 1004. The image (image data) obtained by the signal processing applied by the signal processing circuit 1006 is supplied to the monitor 1007 to be displayed or supplied to the memory 1008 to be stored (recorded).

Also in the imaging device 1001 configured as described above, the imaging element 300 including any of the semiconductor devices 11*a* to 11*g* described above can be applied to the imaging element 1004.

<Application Example to Endoscopic Surgery System>

The technology according to the present disclosure (present technology) can be applied to various products. For example, the technology according to the present disclosure may be applied to an endoscopic surgery system.

FIG. 21 is a view illustrating an example of a schematic configuration of an endoscopic surgery system to which the technology according to the present disclosure (present technology) can be applied.

FIG. 21 illustrates a state in which a surgeon (medical doctor) 11131 is using an endoscopic surgery system 11000 to perform surgery for a patient 11132 on a patient bed 11133. As depicted, the endoscopic surgery system 11000 includes an endoscope 11100, other surgical tools 11110 such as a pneumoperitoneum tube 11111 and an energy device 11112, a supporting arm apparatus 11120 which supports the endoscope 11100 thereon, and a cart 11200 on which various apparatus for endoscopic surgery are mounted.

The endoscope 11100 includes a lens barrel 11101 having a region of a predetermined length from a distal end thereof to be inserted into a body cavity of the patient 11132, and a camera head 11102 connected to a proximal end of the lens barrel 11101. In the example depicted, the endoscope 11100 is depicted which includes as a rigid endoscope having the lens barrel 11101 of the hard type. However, the endoscope 11100 may otherwise be included as a flexible endoscope having the lens barrel 11101 of the flexible type.

The lens barrel 11101 has, at a distal end thereof, an opening in which an objective lens is fitted. A light source apparatus 11203 is connected to the endoscope 11100 such that light generated by the light source apparatus 11203 is introduced to a distal end of the lens barrel 11101 by a light guide extending in the inside of the lens barrel 11101 and is irradiated toward an observation target in a body cavity of the patient 11132 through the objective lens. It is to be noted that the endoscope 11100 may be a forward-viewing endoscope or may be an oblique-viewing endoscope or a side-viewing endoscope.

An optical system and an image pickup element are provided in the inside of the camera head 11102 such that reflected light (observation light) from the observation target is condensed on the image pickup element by the optical system. The observation light is photo-electrically converted by the image pickup element to generate an electric signal corresponding to the observation light, namely, an image signal corresponding to an observation image. The image signal is transmitted as RAW data to a CCU 11201.

The CCU 11201 includes a central processing unit (CPU), a graphics processing unit (GPU) or the like and integrally controls operation of the endoscope 11100 and a display apparatus 11202. Further, the CCU 11201 receives an image signal from the camera head 11102 and performs, for the image signal, various image processes for displaying an image based on the image signal such as, for example, a development process (demosaic process).

The display apparatus 11202 displays thereon an image based on an image signal, for which the image processes have been performed by the CCU 11201, under the control of the CCU 11201.

The light source apparatus 11203 includes a light source such as, for example, a light emitting diode (LED) and supplies irradiation light upon imaging of a surgical region to the endoscope 11100.

An inputting apparatus 11204 is an input interface for the endoscopic surgery system 11000. A user can perform inputting of various kinds of information or instruction inputting to the endoscopic surgery system 11000 through the inputting apparatus 11204. For example, the user would input an instruction or a like to change an image pickup condition (type of irradiation light, magnification, focal distance or the like) by the endoscope 11100.

A treatment tool controlling apparatus 11205 controls driving of the energy device 11112 for cautery or incision of a tissue, sealing of a blood vessel or the like. A pneumoperitoneum apparatus 11206 feeds gas into a body cavity of the patient 11132 through the pneumoperitoneum tube 11111 to inflate the body cavity in order to secure the field of view of the endoscope 11100 and secure the working space for the surgeon. A recorder 11207 is an apparatus capable of recording various kinds of information relating to surgery. A printer 11208 is an apparatus capable of printing various kinds of information relating to surgery in various forms such as a text, an image or a graph.

It is to be noted that the light source apparatus 11203 which supplies irradiation light when a surgical region is to be imaged to the endoscope 11100 may include a white light source which includes, for example, an LED, a laser light source or a combination of them. Where a white light source includes a combination of red, green, and blue (RGB) laser light sources, since the output intensity and the output timing can be controlled with a high degree of accuracy for each color (each wavelength), adjustment of the white balance of a picked up image can be performed by the light source apparatus 11203. Further, in this case, if laser beams from the respective RGB laser light sources are irradiated time-divisionally on an observation target and driving of the image pickup elements of the camera head 11102 are controlled in synchronism with the irradiation timings. Then images individually corresponding to the R, G and B colors can be also picked up time-divisionally. According to this method, a color image can be obtained even if color filters are not provided for the image pickup element.

Further, the light source apparatus 11203 may be controlled such that the intensity of light to be outputted is changed for each predetermined time. By controlling driving of the image pickup element of the camera head 11102 in synchronism with the timing of the change of the intensity of light to acquire images time-divisionally and synthesizing the images, an image of a high dynamic range free from underexposed blocked up shadows and overexposed highlights can be created.

Further, the light source apparatus 11203 may be configured to supply light of a predetermined wavelength band ready for special light observation. In special light observation, for example, by utilizing the wavelength dependency of absorption of light in a body tissue to irradiate light of a narrow band in comparison with irradiation light upon ordinary observation (namely, white light), narrow band observation (narrow band imaging) of imaging a predetermined tissue such as a blood vessel of a superficial portion of the mucous membrane or the like in a high contrast is performed. Alternatively, in special light observation, fluorescent observation for obtaining an image from fluorescent light generated by irradiation of excitation light may be performed. In fluorescent observation, it is possible to perform observation of fluorescent light from a body tissue by irradiating excitation light on the body tissue (autofluorescence observation) or to obtain a fluorescent light image by locally injecting a reagent such as indocyanine green (ICG) into a body tissue and irradiating excitation light corresponding to a fluorescent light wavelength of the reagent upon the body tissue. The light source apparatus 11203 can be configured to supply such narrow-band light and/or excitation light suitable for special light observation as described above.

Figure 22:
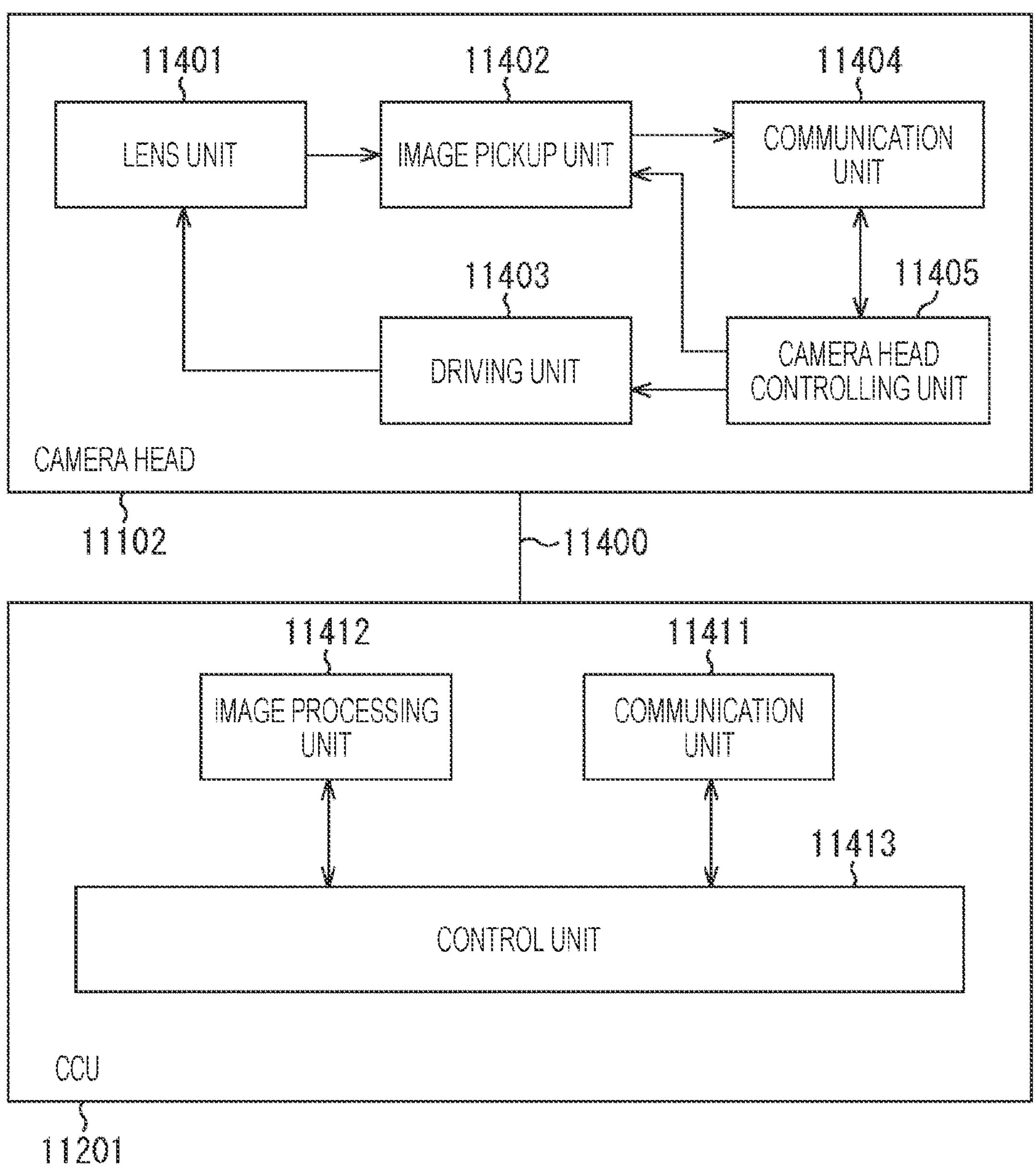
FIG. 22 is a block diagram illustrating an example of a functional configuration of a camera head and a camera control unit (CCU).

FIG. 22 is a block diagram illustrating an example of a functional configuration of the camera head 11102 and the CCU 11201 illustrated in FIG. 21.

The camera head 11102 includes a lens unit 11401, an image pickup unit 11402, a driving unit 11403, a communication unit 11404 and a camera head controlling unit 11405. The CCU 11201 includes a communication unit 11411, an image processing unit 11412 and a control unit 11413. The camera head 11102 and the CCU 11201 are connected for communication to each other by a transmission cable 11400.

The lens unit 11401 is an optical system, provided at a connecting location to the lens barrel 11101. Observation light taken in from a distal end of the lens barrel 11101 is guided to the camera head 11102 and introduced into the lens unit 11401. The lens unit 11401 includes a combination of a plurality of lenses including a zoom lens and a focusing lens.

The number of image pickup elements which is included by the image pickup unit 11402 may be one (single-plate type) or a plural number (multi-plate type). Where the image pickup unit 11402 is configured as that of the multi-plate type, for example, image signals corresponding to respective R, G and B are generated by the image pickup elements, and the image signals may be synthesized to obtain a color image. The image pickup unit 11402 may also be configured so as to have a pair of image pickup elements for acquiring respective image signals for the right eye and the left eye ready for three dimensional (3D) display. If 3D display is performed, then the depth of a living body tissue in a surgical region can be comprehended more accurately by the surgeon 11131. It is to be noted that, where the image pickup unit 11402 is configured as that of stereoscopic type, a plurality of systems of lens units 11401 are provided corresponding to the individual image pickup elements.

Further, the image pickup unit 11402 may not necessarily be provided on the camera head 11102. For example, the image pickup unit 11402 may be provided immediately behind the objective lens in the inside of the lens barrel 11101.

The driving unit 11403 includes an actuator and moves the zoom lens and the focusing lens of the lens unit 11401 by a predetermined distance along an optical axis under the control of the camera head controlling unit 11405. Consequently, the magnification and the focal point of a picked up image by the image pickup unit 11402 can be adjusted suitably.

The communication unit 11404 includes a communication apparatus for transmitting and receiving various kinds of information to and from the CCU 11201. The communication unit 11404 transmits an image signal acquired from the image pickup unit 11402 as RAW data to the CCU 11201 through the transmission cable 11400.

In addition, the communication unit 11404 receives a control signal for controlling driving of the camera head 11102 from the CCU 11201 and supplies the control signal to the camera head controlling unit 11405. The control signal includes information relating to image pickup conditions such as, for example, information that a frame rate of a picked up image is designated, information that an exposure value upon image picking up is designated and/or information that a magnification and a focal point of a picked up image are designated.

It is to be noted that the image pickup conditions such as the frame rate, exposure value, magnification or focal point may be designated by the user or may be set automatically by the control unit 11413 of the CCU 11201 on the basis of an acquired image signal. In the latter case, an auto exposure (AE) function, an auto focus (AF) function and an auto white balance (AWB) function are incorporated in the endoscope 11100.

The camera head controlling unit 11405 controls driving of the camera head 11102 on the basis of a control signal from the CCU 11201 received through the communication unit 11404.

The communication unit 11411 includes a communication apparatus for transmitting and receiving various kinds of information to and from the camera head 11102. The communication unit 11411 receives an image signal transmitted thereto from the camera head 11102 through the transmission cable 11400.

Further, the communication unit 11411 transmits a control signal for controlling driving of the camera head 11102 to the camera head 11102. The image signal and the control signal can be transmitted by electrical communication, optical communication or the like.

The image processing unit 11412 performs various image processes for an image signal in the form of RAW data transmitted thereto from the camera head 11102.

The control unit 11413 performs various kinds of control relating to image picking up of a surgical region or the like by the endoscope 11100 and display of a picked up image obtained by image picking up of the surgical region or the like. For example, the control unit 11413 creates a control signal for controlling driving of the camera head 11102.

Further, the control unit 11413 controls, on the basis of an image signal for which image processes have been performed by the image processing unit 11412, the display apparatus 11202 to display a picked up image in which the surgical region or the like is imaged. Thereupon, the control unit 11413 may recognize various objects in the picked up image using various image recognition technologies. For example, the control unit 11413 can recognize a surgical tool such as forceps, a particular living body region, bleeding, mist when the energy device 11112 is used and so forth by detecting the shape, color and so forth of edges of objects included in a picked up image. The control unit 11413 may cause, when it controls the display apparatus 11202 to display a picked up image, various kinds of surgery supporting information to be displayed in an overlapping manner with an image of the surgical region using a result of the recognition. Where surgery supporting information is displayed in an overlapping manner and presented to the surgeon 11131, the burden on the surgeon 11131 can be reduced and the surgeon 11131 can proceed with the surgery with certainty.

The transmission cable 11400 which connects the camera head 11102 and the CCU 11201 to each other is an electric signal cable ready for communication of an electric signal, an optical fiber ready for optical communication or a composite cable ready for both of electrical and optical communications.

Here, while, in the example depicted, communication is performed by wired communication using the transmission cable 11400, the communication between the camera head 11102 and the CCU 11201 may be performed by wireless communication.

<Application Example to Mobile Body>

The technology according to the present disclosure (present technology) can be applied to various products. For example, the technology according to the present disclosure may also be realized as a device mounted on any type of mobile body such as an automobile, an electric automobile, a hybrid electric automobile, a motorcycle, a bicycle, a personal mobility, an airplane, a drone, a ship, and a robot.

FIG. 23 is a block diagram illustrating a schematic configuration example of a vehicle control system which is an example of a mobile body control system to which the technology according to the present disclosure can be applied.

A vehicle control system 12000 includes a plurality of electronic control units connected to each other via a communication network 12001. In the example illustrated in FIG. 23, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automated driving, which makes the vehicle to travel automatedly without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 23, an audio speaker 12061, a display section 12062, and an instrument panel 12063 are illustrated as the output device. The display section 12062 may, for example, include at least one of an on-board display and a head-up display.

Figure 24:
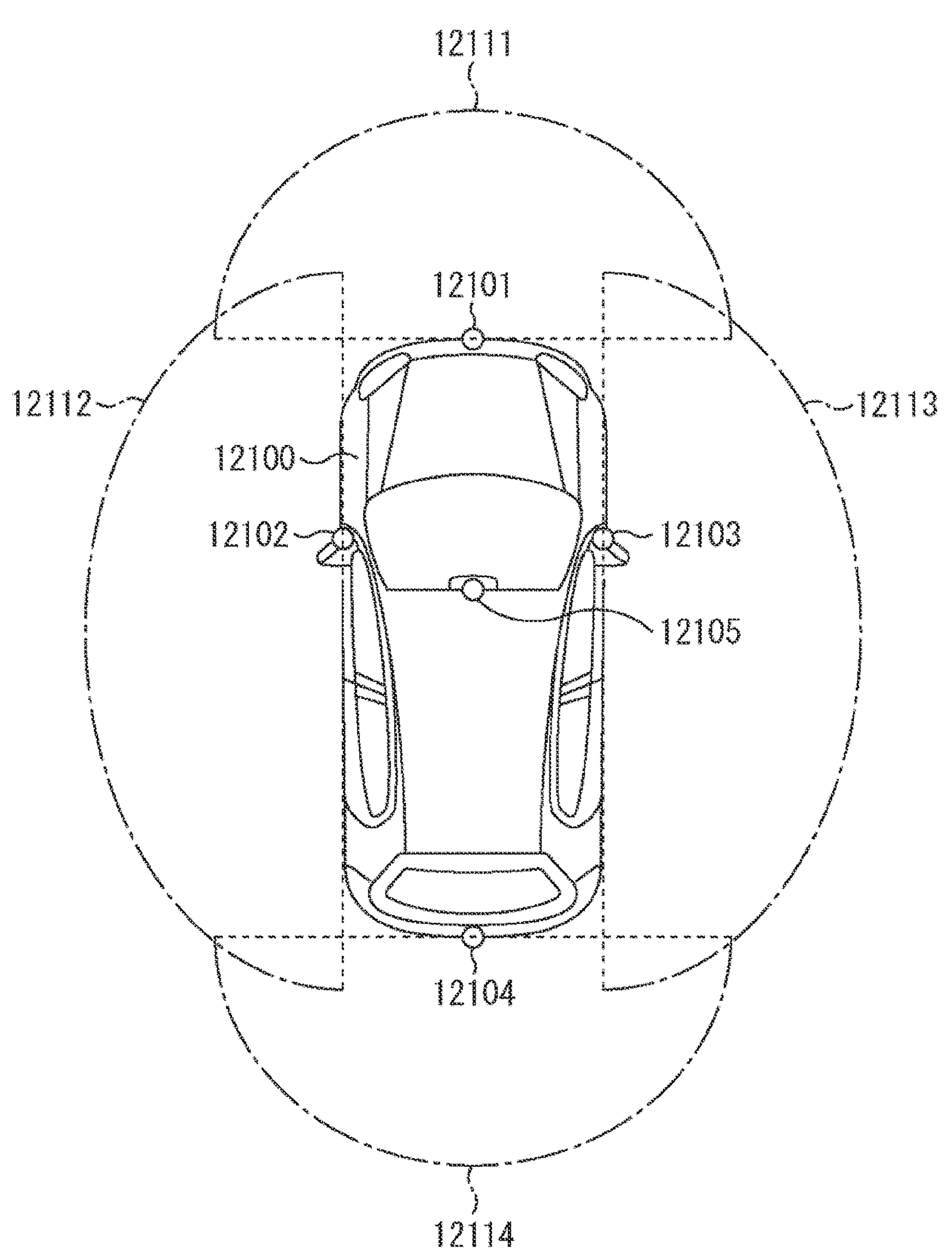
FIG. 24 is an explanatory view illustrating an example of installation positions of an outside-vehicle information detecting section and an imaging section.

FIG. 24 is a view illustrating an example of the installation position of the imaging section 12031.

In FIG. 24, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The imaging section 12105 provided to the upper portion of the windshield within the interior of the vehicle is used mainly to detect a preceding vehicle, a pedestrian, an obstacle, a signal, a traffic sign, a lane, or the like.

Note that FIG. 24 illustrates an example of imaging ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automated driving that makes the vehicle travel automatedly without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

In the present Description, the system represents the entire device including a plurality of devices.

Note that the effects described in the present Description are merely examples and are not limited, and other effects may be provided.

Note that embodiments of the present technology are not limited to the above-described embodiments, and various changes can be made without departing from the gist of the present technology.

Note that the present technology can also have the following configurations.

(1)

A semiconductor device including:
- a first substrate;
- a second substrate;
- a wiring layer that is located between the first substrate and the second substrate; and
- a slit that penetrates the first substrate and reaches the wiring layer.

(2)

The semiconductor device according to (1), in which the wiring layer has a gap connected to the slit.

(3)

The semiconductor device according to (2), in which the gap is provided for each wiring provided in the wiring layer.

(4)

The semiconductor device according to (2), in which the gap includes a plurality of wirings provided in the wiring layer.

(5)

The semiconductor device according to (2), in which the gap is provided in entirety of a region where a wiring is formed in the wiring layer.

(6)

The semiconductor device according to any one of (1) to (5), in which a wiring provided in the wiring layer is connected to an electrode that penetrates the first substrate.

(7)

The semiconductor device according to any one of (2) to (6), in which a wiring located in the gap is a dummy wiring.

(8)

The semiconductor device according to (7), in which the dummy wiring is connected to an electrode that penetrates the first substrate.

(9)

The semiconductor device according to any one of (1) to (8), in which a shape of the slit is any of a linear shape, a polygonal shape, and a circular shape.

(10)

The semiconductor device according to any one of (1) to (9), in which a first chip including the first substrate and a second chip including the second substrate are stacked, the wiring layer is a layer in which a first wiring layer included in the first chip and a second wiring layer included in the second chip are connected, and a first wiring formed in the first wiring layer is located in the gap.

(11)

The semiconductor device according to (10), in which also a second wiring formed in the second wiring layer is located in the gap.

(12)

The semiconductor device according to (10), in which the second chip is a solid-state imaging element.

(13)

An imaging device including:

a first chip on which a solid-state imaging element is formed;

a second chip that processes a signal from the first chip;

a wiring layer in which a first wiring layer included in the first chip and a second wiring layer included in the second chip are connected;

a gap that is provided in part of the wiring layer; and a slit that penetrates the second chip connected to the gap.

REFERENCE SIGNS LIST

11 Semiconductor device
21, 22 Chip
23 Insulating film
24 Through hole
25 Redistribution layer
26 Solder ball
27 Slit
28 Stopper film
31 Lower substrate
32 Lower wiring layer
33, 34 Wiring
35 Interlayer insulating film
41 Upper substrate
42 Upper wiring layer
43, 44 Wiring
45 Interlayer insulating film
51 Gap
52 Wiring
61 Dummy wiring
300 Imaging element
301 On-chip lens
302 Adhesive
303 Transparent substrate

What is claimed is:

1. A semiconductor device, comprising:

a first substrate;

a second substrate;

a wiring layer that is located between the first substrate and the second substrate; and a slit that penetrates the first substrate and reaches the wiring layer, wherein the wiring layer has a gap connected to the slit.

2. The semiconductor device according to claim 1, wherein the gap is provided for each wiring provided in the wiring layer.

3. The semiconductor device according to claim 1, wherein the gap includes a plurality of wirings provided in the wiring layer.

4. The semiconductor device according to claim 1, wherein the gap is provided in entirety of a region where a wiring is formed in the wiring layer.

5. The semiconductor device according to claim 1, wherein a wiring provided in the wiring layer is connected to an electrode that penetrates the first substrate.

6. The semiconductor device according to claim 1, wherein a shape of the slit is any of a linear shape, a polygonal shape, and a circular shape.

7. The semiconductor device according to claim 1, wherein a first chip including the first substrate and a second chip including the second substrate are stacked, the wiring layer is a layer in which a first wiring layer included in the first chip and a second wiring layer included in the second chip are connected, and a first wiring formed in the first wiring layer is located in the gap.

8. The semiconductor device according to claim 7, wherein also a second wiring formed in the second wiring layer is located in the gap.

9. The semiconductor device according to claim 7, wherein the second chip is a solid-state imaging element.

10. The semiconductor device according to claim 1, wherein a wiring located in the gap is a dummy wiring.

11. A semiconductor device, comprising:

a first substrate;

a second substrate;

a wiring layer that is located between the first substrate and the second substrate; and a slit that penetrates the first substrate and reaches the wiring layer, wherein a wiring located in a gap is a dummy wiring.

12. The semiconductor device according to claim 11, wherein the dummy wiring is connected to an electrode that penetrates the first substrate.

13. The semiconductor device according to claim 11, wherein a wiring provided in the wiring layer is connected to an electrode that penetrates the first substrate.

14. The semiconductor device according to claim 11, wherein a shape of the slit is any of a linear shape, a polygonal shape, and a circular shape.

15. The semiconductor device according to claim 11, wherein a first chip including the first substrate and a second chip including the second substrate are stacked, the wiring layer is a layer in which a first wiring layer included in the first chip and a second wiring layer included in the second chip are connected, and a first wiring formed in the first wiring layer is located in the gap.

16. A semiconductor device, comprising:

a first substrate;

a second substrate;

a wiring layer that is located between the first substrate and the second substrate; and a slit that penetrates the first substrate and reaches the wiring layer, wherein a first chip including the first substrate and a second chip including the second substrate are stacked, the wiring layer is a layer in which a first wiring layer included in the first chip and a second wiring layer included in the second chip are connected, and a first wiring formed in the first wiring layer is located in a gap.

17. The semiconductor device according to claim 16, wherein also a second wiring formed in the second wiring layer is located in the gap.

18. The semiconductor device according to claim 16, wherein the second chip is a solid-state imaging element.

19. The semiconductor device according to claim 16, wherein a shape of the slit is any of a linear shape, a polygonal shape, and a circular shape.

20. An imaging device, comprising:

a first chip on which a solid-state imaging element is formed;

a second chip that processes a signal from the first chip;

a wiring layer in which a first wiring layer included in the first chip and a second wiring layer included in the second chip are connected;

a gap that is provided in part of the wiring layer; and a slit that penetrates the second chip connected to the gap.

* * * * *